(12) United States Patent
Iwata

(10) Patent No.: US 7,623,384 B2
(45) Date of Patent: Nov. 24, 2009

(54) NONVOLATILE SEMICONDUCTOR MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/767,234

(22) Filed: Jun. 22, 2007

(65) Prior Publication Data
US 2007/0297232 A1  Dec. 27, 2007

(30) Foreign Application Priority Data
Jun. 22, 2006  (JP) .............................. 2006-172833

(51) Int. Cl.
G11C 16/04  (2006.01)
(52) U.S. Cl. ............................ 365/185.17; 365/185.03; 365/185.18
(58) Field of Classification Search ............ 365/185.17, 365/185.03, 185.18
See application file for complete search history.

(56) References Cited

U.S. PATENT DOCUMENTS

| | | | |
|---|---|---|---|
| 6,566,698 B2 | 5/2003 | Nishihara et al. | |
| 7,272,040 B2 * | 9/2007 | Mikolajick et al. | 365/185.03 |
| 2004/0124466 A1 | 7/2004 | Walker et al. | |
| 2004/0155302 A1 | 8/2004 | Zhang | |
| 2007/0176218 A1 * | 8/2007 | Kang | 257/295 |

FOREIGN PATENT DOCUMENTS

| | | |
|---|---|---|
| JP | 2002-94020 | 3/2002 |
| JP | 2002-197857 | 7/2002 |

OTHER PUBLICATIONS

Andrew J. Walker, et al., "3D TFT-SONOS Memory Cell for Ultra-High Density File Storage Applications," Symposium on VLSI Technology Digest of Technical Papers, 2003, 2 pages.
Mark Johnson, et al., "512-Mb PROM With a Three-Dimensional Array of Diode/ Antifuse Memory Cells," IEEE Journal of Solid-State Circuits, vol. 38, No. 11, Nov. 2003, pp. 1920-1928.
Kang-Deong Suh, et al., "A 3.3V 32Mb NAND Flash Memory with Incremental Step Pulse Programming Scheme," IEEE, International Solid-State Circuits Conference, ISSCC, Session 7, Flash Memory, Paper TA 7.5, Digest of Technical Papers, Feb. 16, 1995, pp. 128-129 and p. 350.

* cited by examiner

Primary Examiner—Huan Hoang
(74) Attorney, Agent, or Firm—Oblon, Spivak, McClelland, Maier & Neustadt, L.L.P.

(57) ABSTRACT

According to one embodiment, a nonvolatile semiconductor memory comprising: a source line side selection gate transistor that is having a first source region connected to a source line and a first gate electrode connected to a first select gate line; a bit line side selection gate transistor that is having a second drain region connected to a bit line and a second gate electrode connected to a second select gate line; a first memory cell string that is having a plurality of memory cell transistors connected in series, connected between a first drain region of the source line side selection gate transistor and a second source region of the bit line side selection gate transistor; and a second memory cell string that is having a plurality of memory cell transistors connected in series, connected in parallel with the first memory cell string; wherein the first memory cell string and the second memory cell string are stacked on a semiconductor substrate via an interlayer insulating film, wherein the source line side selection gate transistor and the bit line side selection gate transistor are placed on the semiconductor substrate.

16 Claims, 28 Drawing Sheets

FIG. 15

| | | SELECTED BLOCK | | | | | UNSELECTED BLOCK | | | |
|---|---|---|---|---|---|---|---|---|---|---|
| | SL | BL | SGS | SGD | SELECTED CG | UNSELECTED CG (SAME LAYER) | UNSELECTED CG (DIFFERENT LAYER) | SL | BL | SGS | SGD | CG |
| READ | VDD | FLOATING (VSS PRECHARGE) | VDD | VDD | VSS | VRR | VNN | VDD | VSS | VSS | VSS | VSS |
| '0' WRITE | VDD | VSS | VDD ⇒VSS | VSS ⇒VDD | VPP | VMM | VMM | VDD | VSS | VSS | VSS | VSS |
| '1' WRITE | VDD | VDD | | | | | | | | | | |
| ERASE | VEE | VSS | VEE | VSS | VSS/VXX | - | - | VDD | VSS | VSS | VSS | VSS |

FIG. 19

|  | SELECTED BLOCK | | | | UNSELECTED BLOCK | | | | |
|---|---|---|---|---|---|---|---|---|---|
|  | SL | BL | SGS SGD | SELECTED CG | UNSELECTED CG (SAME LAYER) | UNSELECTED CG (DIFFERENT LAYER) | SL | BL | SGS | SGD | CG |
| READ | VSS | FLOATING (VDD PRECHARGE) | VDD VDD | VSS | VRR | VNN | VSS | VSS | VSS | VSS | VSS |
| '0' WRITE | VSS | VSS | VDD VDD ⇒VSS ⇒VSS | VPP | VMM | VMM | VSS | VSS | VSS | VSS | VSS |
| '1' WRITE |  | VDD |  |  |  |  |  |  |  |  |  |
| ERASE | VEE | VSS | VEE VSS | VSS, VXX | - | - | VSS | VSS | VSS | VSS | VSS |

FIG. 23

| | SELECTED BLOCK | | | | | | | UNSELECTED BLOCK | | | | |
|---|---|---|---|---|---|---|---|---|---|---|---|---|
| | BG | BL | SGS | SGD | SELECTED CG | UNSELECTED CG (SAME LAYER) | UNSELECTED CG (DIFFERENT LAYER) | BG | BL | SGS | SGD | CG |
| READ | VSS | FLOATING (VDD PRECHARGE) | VDD | VDD | VSS | VRR | VNN | VSS | VSS | VSS | VSS | VSS |
| '0' WRITE | VSS | VSS | VDD →VSS | VDD →VSS | VPP | VMM | VMM | VSS | VSS | VSS | VSS | VSS |
| '1' WRITE | | VDD | | | | | | | | | | |
| ERASE | VEE | VSS | VSS | VSS | VSS | · | · | VSS | VSS | VSS | VSS | VSS |

NONVOLATILE SEMICONDUCTOR MEMORY

CROSS-REFERENCE TO RELATED APPLICATIONS

This application is based upon and claims the benefit of priority from the prior Japanese Patent Applications No. 2006-172833, filed on Jun. 22, 2006; the entire contents of which are incorporated herein by reference.

BACKGROUND

One embodiment of the invention relates to a nonvolatile semiconductor memory and particularly to a nonvolatile semiconductor memory having memory cell transistors stacked for providing a large memory capacity.

A NAND nonvolatile semiconductor memory has a configuration wherein transistors each containing a charge storage layer in a gate insulating film, for example, memory cell transistors of a stacked gate structure having a floating gate electrode layer or memory cell transistors (MONOS structure or SONOS structure) each with an insulating film (ONO structure) implemented as a stacked structure of silicon oxide film/silicon nitride film/silicon oxide film as a gate insulating film are connected in series as memory cells and both ends are sandwiched between selection gate transistors of usual MOS transistors.

If the selection gate transistor is a transistor implemented as a stacked structure of the same structure as the memory cell transistor, the possibility that electrons or holes may be stored in the charge storage layer of the selection gate transistor because of a voltage stress in a read state is not nil although it is not intended that write or erase is executed for the selection gate transistor. In this case, if the selection gate transistor is an n-channel MOS transistor, it is not turned on as the threshold value becomes high by storing electrons in the charge storage layer or it is not turned off as the threshold value becomes low by storing holes in the charge storage layer, and these situations cause a problem of hindering selectivity. Thus, the selection gate transistor needs a manufacturing process separate from the memory cell transistor.

If the memory cell transistor has an ONO structure, a silicon oxide film, a silicon nitride film, and a silicon oxide film are formed on a silicon semiconductor substrate or a silicon oxide film and a silicon nitride film are formed and then in the portion which will become a selection gate transistor region, once formed insulating film is peeled off and then a silicon oxide film is formed by oxidation for forming the selection gate transistor as a usual MOS transistor.

If the memory cell transistor has a floating gate structure, it is desirable that the selection gate transistor and the memory cell transistor should be of the same structure in working on gates containing lithography. Therefore, although the gate electrode of the lower layer is not separated for each selection gate transistor, the selection gate transistor also becomes a two-layer structure. However, it becomes a floating gate structure as it is and thus it is necessary to provide a contact portion of a two-layer gate made up of a floating gate electrode layer and a control gate electrode layer at a cell array end or in a cell array.

As described above, the manufacturing process is complicated in the presence of the selection gate transistor, and a space accompanying separation creation of a gate insulating film is required between the selection gate transistor and the memory cell transistor, and a space to connect one gate electrode layer with an other gate electrode layer becomes necessary, resulting in an increase in the memory cell size or the memory cell array region.

An example of applying a memory cell transistor of a thin film transistor (TFT) having a charge storage dielectric layer of an ONO structure placed in a NAND string connected in series to three-dimensional flash memory is already disclosed. (For example, refer to USP Laid-Open No. 2004/0124466 and A. J. Walker, et al., "3D TFT-SONOS Memory Cell for Ultra-High Density File Storage Applications," 2003 Symposium on VLSI Technology Digest of Technical Papers, June 2003).) Likewise, three-dimensional mask programmable ROM and its peripheral circuit configuration are also already disclosed. (For example, refer to USP Laid-Open No. 2004/0155302.)

Three-dimensional PROM having a stack structure wherein eight layers of diode/antifuse memory cells are placed in a longitudinal direction is already disclosed. (For example, refer to M. Johnson, et al., "512-Mb PROM With a Three-Dimensional Array of Diode/Antifuse Memory Cells," IEEE J. Solid-State Circuits, Vol. 38, No. 11, pp. 1920-1928, November 2003).) Further, NAND flash memory based on incremental step pulse programming (ISPP) scheme for making it possible to decrease page program current by self-boosting program suppression voltage and accomplishing high-speed read throughput with an interleaved data path is already disclosed. (For example, refer to K-D. Sung, et al., "A 3.3V 32 Mb NAND Flash Memory with Incremental Step Pulse Programming Scheme," 1995 IEEE International Solid-State Circuits Conference Digest of Technical Papers, pp. 128-129, 15-17 Feb. 1995).)

SUMMARY

According to one embodiment of the present invention, a nonvolatile semiconductor memory comprising: a source line side selection gate transistor that is having a first source region connected to a source line and a first gate electrode connected to a first select gate line; a bit line side selection gate transistor that is having a second drain region connected to a bit line and a second gate electrode connected to a second select gate line; a first memory cell string that is having a plurality of memory cell transistors connected in series, connected between a first drain region of the source line side selection gate transistor and a second source region of the bit line side selection gate transistor; and a second memory cell string that is having a plurality of memory cell transistors connected in series, connected in parallel with the first memory cell string; wherein the first memory cell string and the second memory cell string are stacked on a semiconductor substrate via an interlayer insulating film, wherein the source line side selection gate transistor and the bit line side selection gate transistor are placed on the semiconductor substrate.

As described above, in the NAND-type nonvolatile semiconductor memory, while the selection gate transistors are placed on the semiconductor substrate and the selectivity of a NAND type memory cell transistor by the selection gate transistor is maintained, the memory cell transistors can be stacked for providing a large memory capacity.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

FIG. 14(a) is a schematic planar pattern drawing of a NAND cell part plain of a fourth layer; FIG. 14(b) is a schematic planar pattern drawing of a NAND cell part plain of a third layer; FIG. 14(c) is a schematic planar pattern drawing of a NAND cell part plain of a second layer; FIG. 14(d) is a schematic planar pattern drawing of a NAND cell part plain of a first layer; and FIG. 14(e) is a schematic planar pattern drawing of a select gate part plain;

FIG. 15 shows an operation voltage example of the nonvolatile semiconductor memory according to the first embodiment of the invention;

FIG. 19 shows another operation voltage example of the nonvolatile semiconductor memory according to the first embodiment of the invention;

FIG. 21(a) is a schematic planar pattern drawing of a NAND cell part plain of a fourth layer; FIG. 21(b) is a schematic planar pattern drawing of a NAND cell part plain of a third layer; FIG. 21(c) is a schematic planar pattern drawing of a NAND cell part plain of a second layer; FIG. 21(d) is a schematic planar pattern drawing of a NAND cell part plain of a first layer; and FIG. 21(e) is a schematic planar pattern drawing of a select gate part plain;

FIG. 23 shows an operation voltage example of the nonvolatile semiconductor memory according to the third embodiment of the invention;

FIG. 27(a) is an alternate drawing planar pattern drawing of a word line CG13 of a first layer; FIG. 27(b) is an alternate drawing planar pattern drawing of a word line CG23 of a second layer; FIG. 27(c) is an alternate drawing planar pattern drawing of a word line CG33 of a third layer; and FIG.

27(d) is an alternate drawing planar pattern drawing of a word line CG43 of a fourth layer.

DETAILED DESCRIPTION

Figure 1:
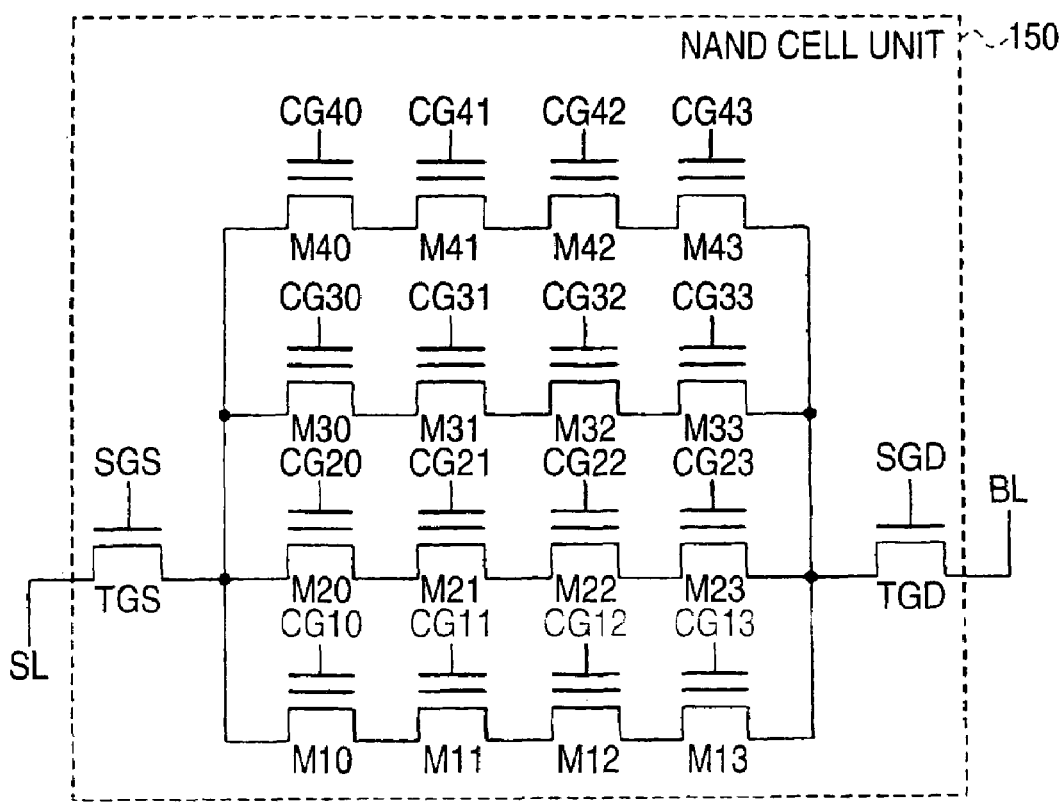
FIG. 1 is an exemplary drawing to show the schematic circuit configuration of a NAND cell unit having memory cell transistors each provided with a stack gate stacked structure, of a nonvolatile semiconductor memory according to a first embodiment of the invention.

First to sixth embodiments of the invention will be discussed with reference to the accompanying drawings. The identical parts or similar parts described below with reference to the accompanying drawings are denoted by the same or similar reference numerals. However, it should be noted that the accompanying drawings are schematic and the relationship between the thickness and plain dimensions, the ratio among the thicknesses of layers, and the like are different from those which are actual. Therefore, the specific thicknesses and dimensions should be determined in consideration of the description to follow. The accompanying drawings contain portions where mutual dimension relationship and ratio differ, of course.

The following first to sixth embodiments illustrate apparatus and methods for embodying the technical idea of the invention and the technical idea of the invention does not limit the materials, shapes, structures, placement, etc., of components to those described below. Various changes can be added to the technical idea of the invention in the claims.

First Embodiment

Stack Gate Stacked Structure

An example of a memory cell transistor applied to a nonvolatile semiconductor memory according to a first embodiment of the invention includes a stack gate stacked structure made up of source/drain regions, a channel region between the source/drain regions, a gate insulating film placed on the channel region, a floating gate electrode layer placed on the gate insulating film, a gate-to-gate insulating film placed on the floating gate electrode layer, and a control gate electrode layer placed on the gate-to-gate insulating film.

The schematic circuit configuration of a NAND cell unit 150 having memory cell transistors each including a stack gate structure, of the nonvolatile semiconductor memory according to the first embodiment of the invention includes a source line side selection gate transistor TGS having a source region connected to a source line SL and a gate electrode connected to a select gate line SGS, a bit line side selection gate transistor TGD having a drain region connected to a bit line BL and a gate electrode connected to a select gate line SGD, a first memory cell string having memory cell transistors M10, M11, M12, and M13 of a stack gate structure connected in series through source/drain regions of the memory cell transistors, connected between the drain region of the source line side selection gate transistor TGS and the source region of the bit line side selection gate transistor TGD, a second memory cell string having memory cell transistors M20, M21, M22, and M23 of a stack gate structure connected in series through source/drain regions of the memory cell transistors, connected between the drain region of the source line side selection gate transistor TGS and the source region of the bit line side selection gate transistor TGD, connected in parallel with the first memory cell string, a third memory cell string having memory cell transistors M30, M31, M32, and M33 of a stack gate structure connected in series through source/drain regions of the memory cell transistors, connected between the drain region of the source line side selection gate transistor TGS and the source region of the bit line side selection gate transistor TGD, connected in parallel with the first and second memory cell strings, and a fourth memory cell string having memory cell transistors M40, M41, M42, and M43 of a stack gate structure connected in series through source/drain regions of the memory cell transistors, connected between the drain region of the source line side selection gate transistor TGS and the source region of the bit line side selection gate transistor TGD, connected in parallel with the first to third memory cell strings, as shown in FIG. 1.

(SONOS Structure)

Another example of a memory cell transistor applied to the nonvolatile semiconductor memory according to the first embodiment of the invention includes a stack gate structure made up of source/drain regions, a channel region between the source/drain regions, an ONO insulating film placed on the channel region, and a control gate electrode layer placed on the ONO insulating film.

Figure 2:
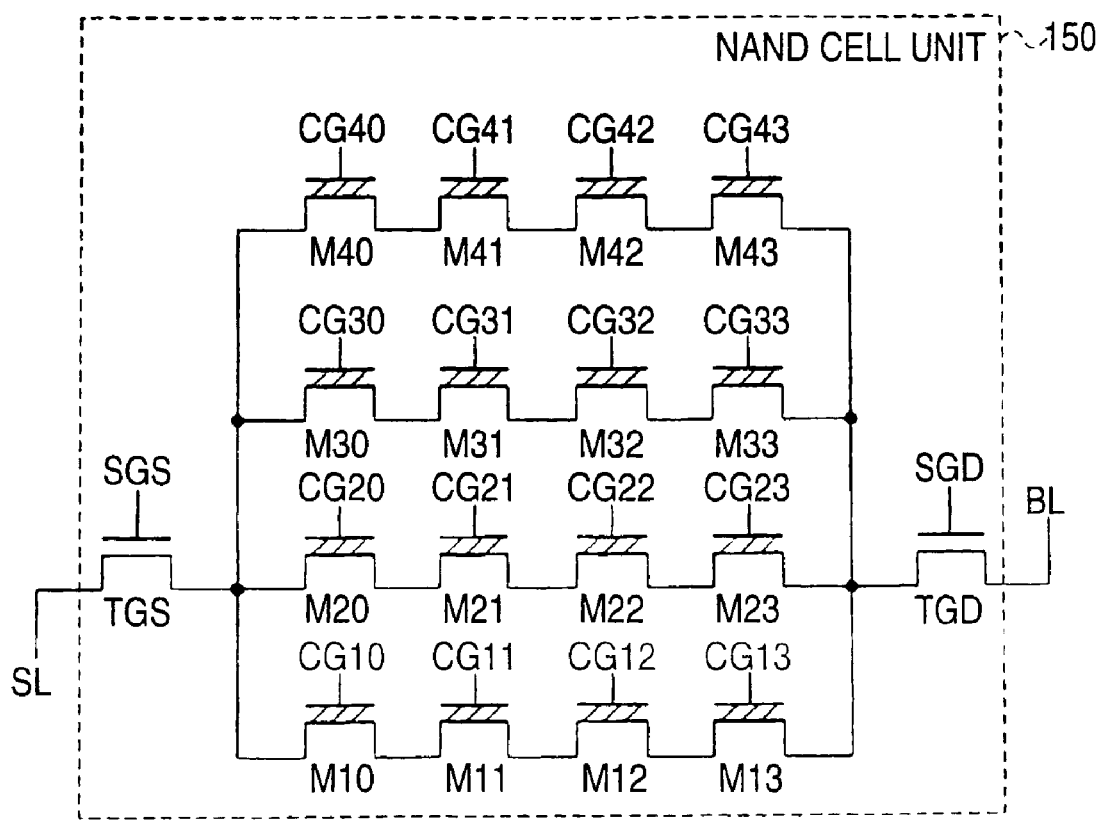
FIG. 2 is an exemplary drawing to show the schematic circuit configuration of a NAND cell unit having memory cell transistors each provided with a SONOS structure, of the nonvolatile semiconductor memory according to the first embodiment of the invention.

The schematic circuit configuration of a NAND cell unit 150 having memory cell transistors each including a SONOS structure, of the nonvolatile semiconductor memory according to the first embodiment of the invention includes a source line side selection gate transistor TGS having a source region connected to a source line SL and a gate electrode connected to a select gate line SGS, a bit line side selection gate transistor TGD having a drain region connected to a bit line BL and a gate electrode connected to a select gate line SGD, a first memory cell string having memory cell transistors M10, M11, M12, and M13 of an SONOS structure connected in series through source/drain regions of the memory cell transistors, connected between the drain region of the source line side selection gate transistor TGS and the source region of the bit line side selection gate transistor TGD, a second memory cell string having memory cell transistors M20, M21, M22, and M23 of an SONOS structure connected in series through source/drain regions of the memory cell transistors, connected between the drain region of the source line side selection gate transistor TGS and the source region of the bit line side selection gate transistor TGD, connected in parallel with the first memory cell string, a third memory cell string having memory cell transistors M30, M31, M32, and M33 of an SONOS structure connected in series through source/drain regions of the memory cell transistors, connected between the drain region of the source line side selection gate transistor TGS and the source region of the bit line side selection gate transistor TGD, connected in parallel with the first and second memory cell strings, and a fourth memory cell string having memory cell transistors M40, M41, M42, and M43 of an SONOS structure connected in series through source/drain regions of the memory cell transistors, connected between the drain region of the source line side selection gate transistor TGS and the source region of the bit line side selection gate transistor TGD, connected in parallel with the first to third memory cell strings, as shown in FIG. 2.

In the first to fourth memory cell strings of the nonvolatile semiconductor memory according to the first embodiment of the invention, control gate electrodes of the memory cell transistors are connected to different word lines CG10, CG11, CG12, CG13, CG20, CG21, CG22, CG23, . . . , CG40, CG41, CG42, CG43.

In the nonvolatile semiconductor memory according to the first embodiment of the invention, the first to fourth memory cell strings are placed as a stacked structure of four layers insulated from each other by an interlayer insulating film.

Therefore, the occupation area of 16 NAND-type memory cell transistors connected in series can be implemented as the occupation area of four NAND-type memory cell transistors connected in series.

In the nonvolatile semiconductor memory according to the first embodiment of the invention, the number of memory cell transistors connected in series in one memory cell string is not limited to four. The number of stacked layers is not limited to four either. For example, a memory cell string can also be implemented as only one memory cell transistor to realize high-speed read.

In the nonvolatile semiconductor memory according to the first embodiment of the invention, both the source line side selection gate transistor TGS and the bit line side selection gate transistor TGD are placed on the semiconductor substrate.

(General Block Configuration)

Figure 3:
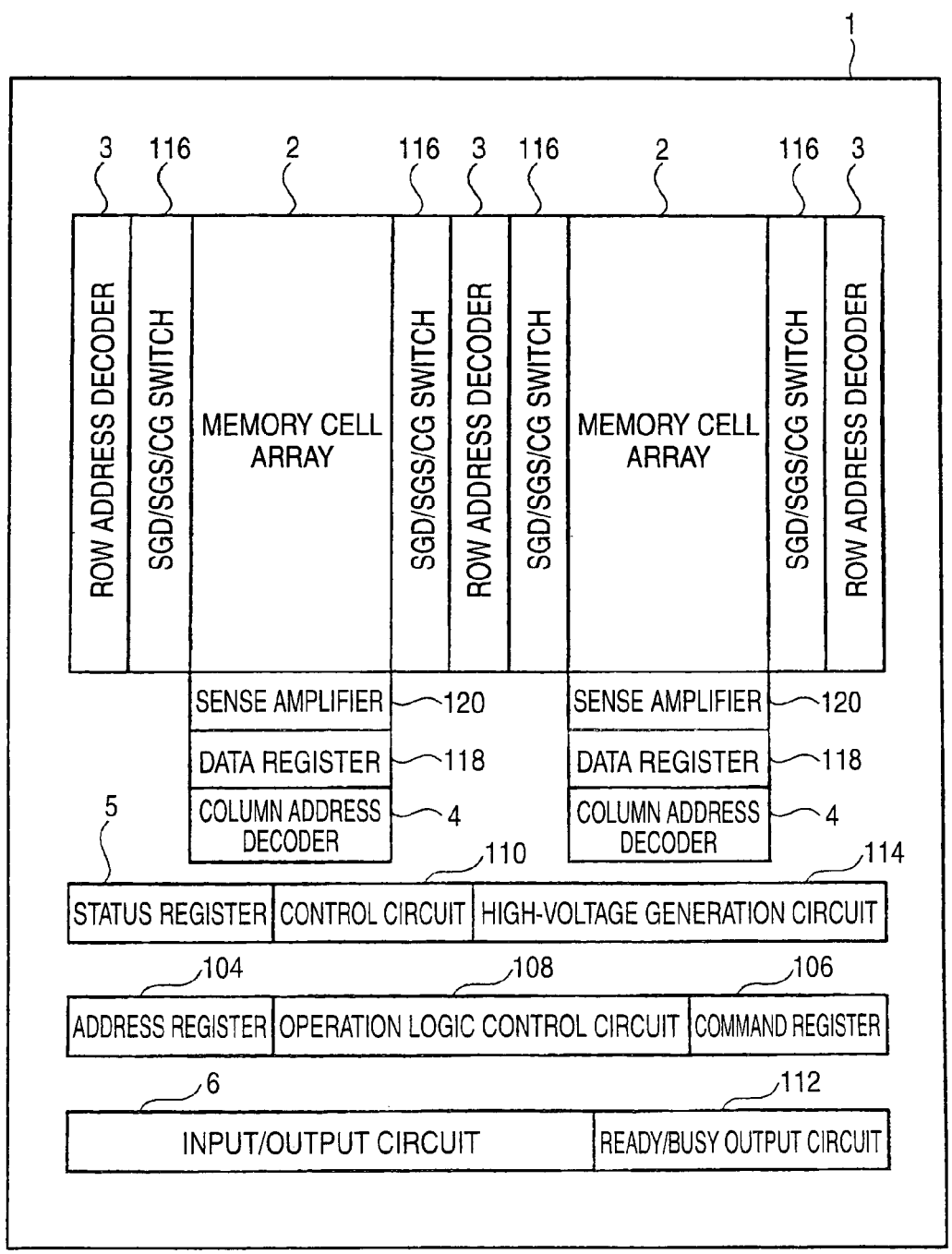
FIG. 3 is an exemplary schematic general block diagram of the nonvolatile semiconductor memory according to the first embodiment of the invention.

The schematic general block configuration of the nonvolatile semiconductor memory according to the first embodiment of the invention is as shown in FIG. 3, namely, memory cell arrays 2, row address decoders 3 and column address decoders 4 placed on the periphery of each memory cell array 2, a status register 5, an input/output circuit 6, SGD/SGS/CG switches 116, sense amplifiers 120, data registers 118, a control circuit 110, a high-voltage generation circuit 114, a ready/busy output circuit 112, an address register 104, a command register 106, and an operation logic control circuit 108 are placed on a semiconductor chip 1.

Figure 4:
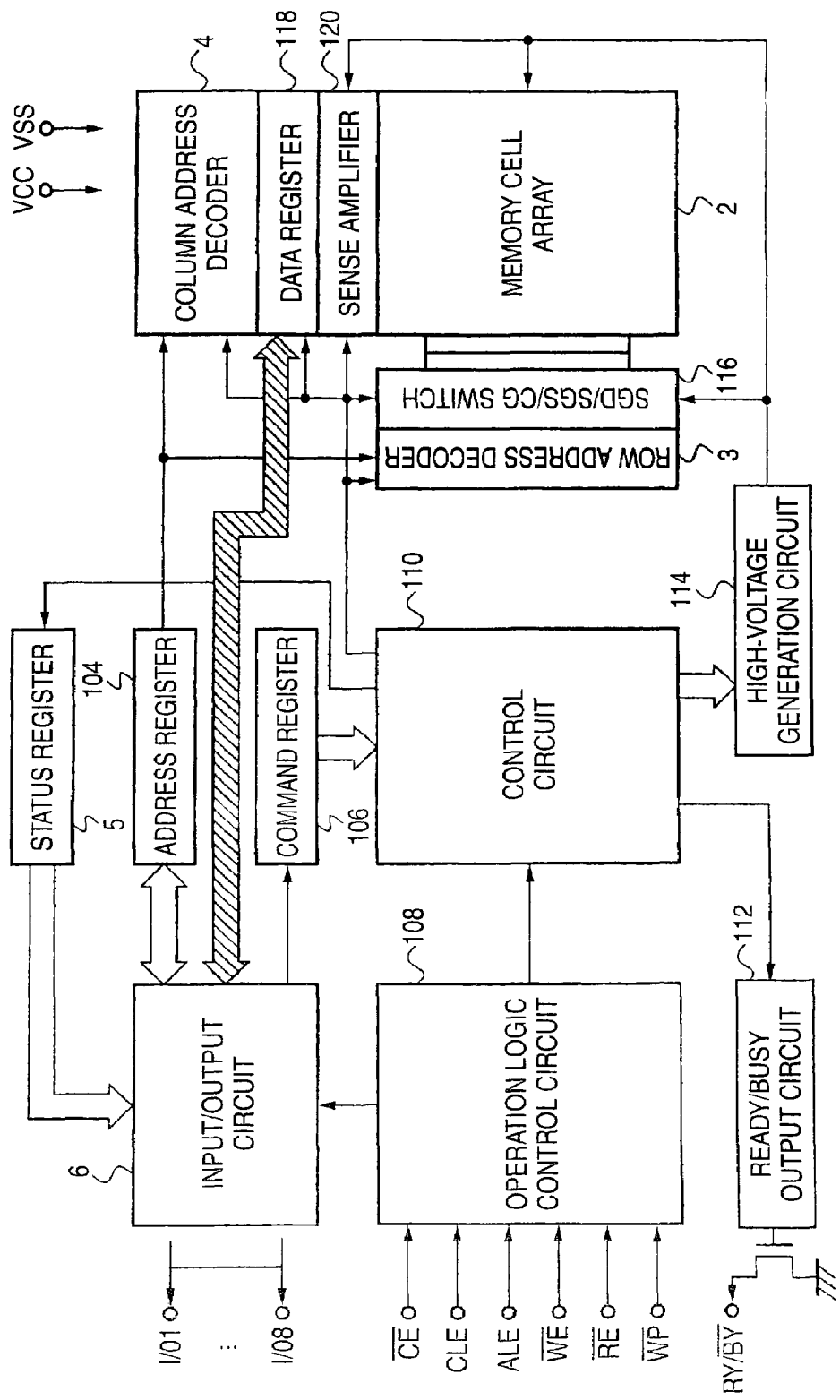
FIG. 4 is an exemplary detailed general block diagram of the nonvolatile semiconductor memory according to the first embodiment of the invention.

The detailed general block configuration of the nonvolatile semiconductor memory according to the first embodiment of the invention is as shown in FIG. 4, namely, the nonvolatile semiconductor memory includes a memory cell array 2, a sense amplifier 120, a data register 118, and a column address decoder 4 placed on the periphery of the memory cell array 2 in the column direction thereof, an SGD/SGS/CG switch 116 and a row address decoder 3 placed on the periphery of the memory cell array 2 in the row direction thereof, a high-voltage generation circuit 114 for supplying a high-voltage signal pulse to the SGD/SGS/CG switch 116, the memory cell array 2, and the sense amplifier 120, a control circuit 110 for supplying a control signal to the high-voltage generation circuit 114 and the peripheral circuit section of the memory cell array 2, a command register 106 for supplying a command signal to the control circuit 110, an address register 104 for supplying an address signal to the column address decoder 4 and the row address decoder 3, a status register 5 and a ready/busy output circuit 112 for receiving a control signal from the control circuit 110, an operation logic control circuit 108 for supplying a control signal to the control circuit 110, and an input/output circuit 6 for receiving a control signal from the operation logic control circuit 108, receiving status information from the status register 5, supplying a command signal to the command register 106, and transmitting and receiving data to and from the address register 104 and the data register 118.

Address, data, command input/output ports I/O1 to I/O8 are connected to the input/output circuit 6 as shown in FIG. 4. A chip enable signal/CE, a command latch enable signal/CLE, an address latch enable signal/ALE, a write enable signal/WE, a read enable signal/RE, and a write protect signal/WP are supplied to the operation logic control circuit 108 as shown in FIG. 4. From the ready/busy output circuit 112, a ready/busy output signal RY//BY is output through a MOS transistor as shown in FIG. 4. VCC denotes power supply potential and VSS denotes ground potential.

(Layout Block Configuration Example 1)

Figure 5:
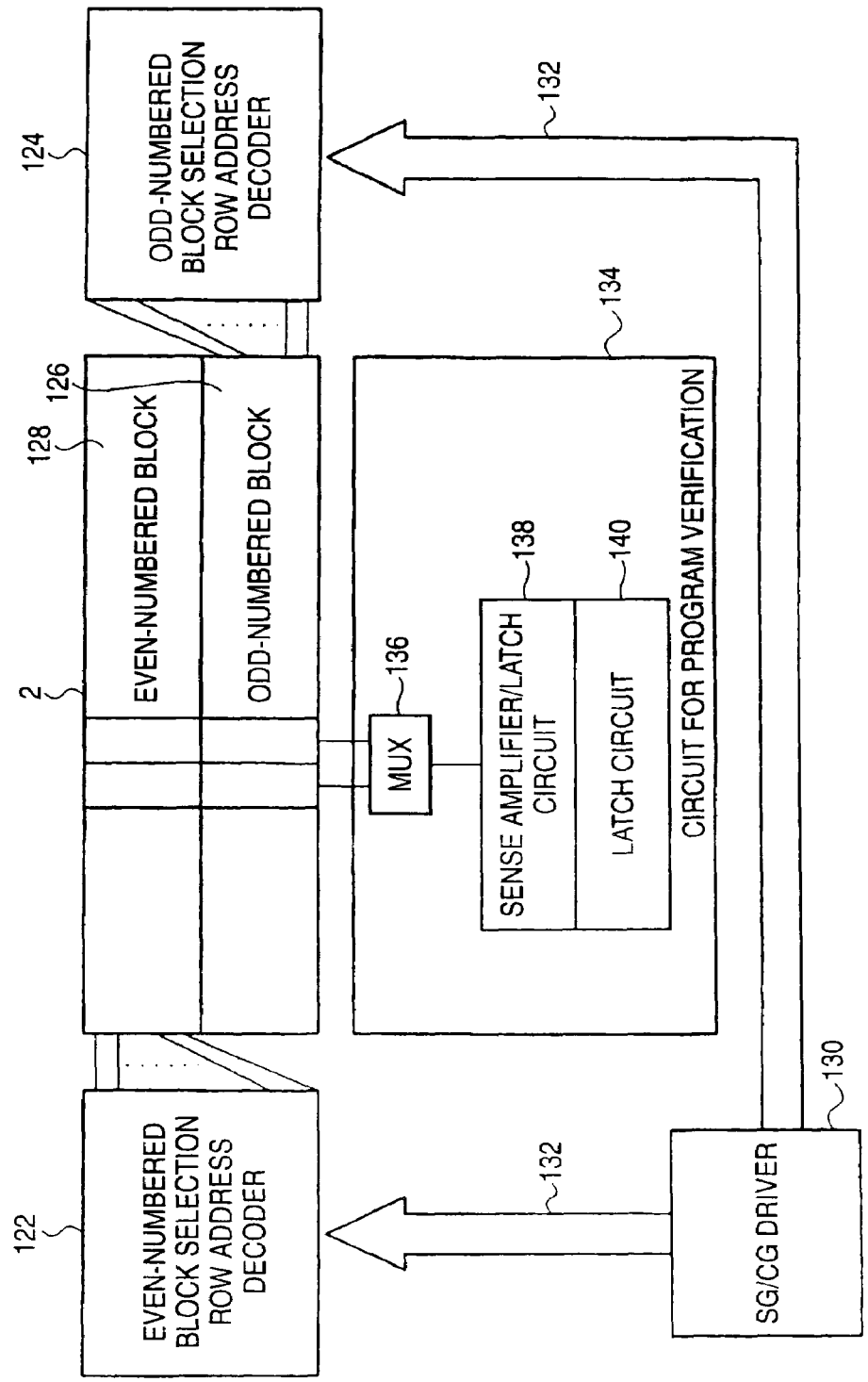
FIG. 5 is an exemplary block diagram to show a first layout block configuration example of the nonvolatile semiconductor memory according to the first embodiment of the invention.

In the nonvolatile semiconductor memory according to the first embodiment of the invention, a first layout block configuration example includes a memory cell array 2 divided into an odd-numbered block 126 and an even-numbered block 128, an even-numbered block selection row address decoder 122 connected to the even-numbered block 128, an odd-numbered block selection row address decoder 124 connected to the odd-numbered block 126, a verifying circuit 134 containing a multiplexer 136 connected to bit lines BL of the memory cell array 2, a sense amplifier/latch circuit 138 and a latch circuit 140 connected to the multiplexer 136, a data register 118, a column address decoder 4, and other circuits, and an SG/CG driver 130 connected to the even-numbered block selection row address decoder 122 and the odd-numbered block selection row address decoder 124 through a bus 132, as shown in FIG. 5. A bit line BL not connected to a sense amplifier 120 serves as a shield line.

(Layout Circuit Configuration Example 1)

Figure 6:
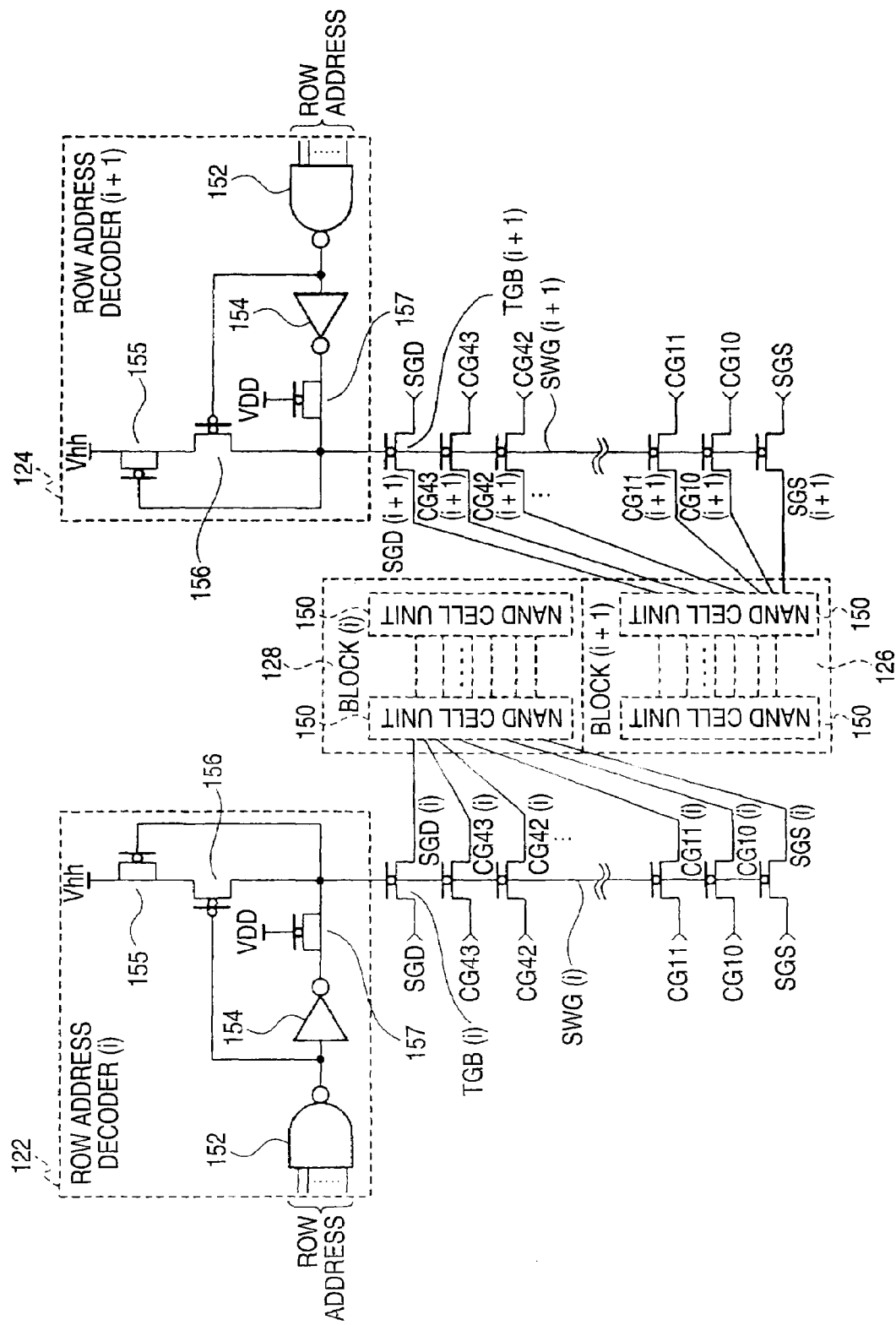
FIG. 6 is an exemplary circuit diagram corresponding to the first layout block configuration example of the nonvolatile semiconductor memory according to the first embodiment of the invention.

The circuit configuration corresponding to the first layout block configuration example of the nonvolatile semiconductor memory according to the first embodiment of the invention includes an even-numbered block 128 having a plurality of NAND cell units 150 placed in parallel in a row direction, an odd-numbered block 126 having a plurality of NAND cell units 150 placed in parallel in the row direction, block selection transistors TGB (i) for selecting a bit line side select gate line SGD (i), a source line side select gate line SGS (i), and word lines CG10 (*i*), CG11 (*i*), . . . , CG42 (*i*), CG 43 (*i*) connected to the even-numbered block 128, block selection transistors TGB (i+1) for selecting a bit line side select gate line SGD (i+1), a source line side select gate line SGS (i+1), and word lines CG10 (*i*+1), CG11 (*i*+1), . . . , CG42 (*i*+1), CG 43 (*i*+1) connected to the odd-numbered block 126, an even-numbered block selection row address decoder 122 for supplying a row address decode signal to a select gate line SWG (i) connected to gates of the block selection transistors TGB (i) in common, and an odd-numbered block selection row address decoder 124 for supplying a row address decode signal to a select gate line SWG (i+1) connected to gates of the block selection transistors TGB (i+1) in common, as shown in FIG. 6.

The even-numbered block selection row address decoder 122 includes an NAND gate 152 for inputting a row address signal, an inverter 154 connected to output of the NAND gate 152, a transfer MOS transistor 157 connected to output of the inverter 154 and having a gate connected to power supply voltage VDD (power supply voltage generated from supplied power supply voltage VCC in the chip or supplied power supply voltage VCC depending on the specifications) and a source connected to the select gate line SWG (i), a transfer MOS transistor 155 having a drain connected to power supply voltage Vhh generated from supplied power supply voltage VCC or VDD in the chip and a gate connected to the select gate line SWG (i), and a MOS transistor 156 having a drain connected to the source of the MOS transistor 155, a gate connected to the output of the NAND gate 152, and a source connected to the select gate line SWG (i), as shown in FIG. 6.

Likewise, the odd-numbered block selection row address decoder 124 includes an NAND gate 152 for inputting a row address signal, an inverter 154 connected to output of the NAND gate 152, a transfer MOS transistor 157 connected to output of the inverter 154 and having a gate connected to power supply voltage VDD and a source connected to the select gate line SWG (i+1), a transfer MOS transistor 155 having a drain connected to power supply voltage Vhh and a gate connected to the select gate line SWG (i+1), and a MOS transistor 156 having a drain connected to the source of the MOS transistor 155, a gate connected to the output of the NAND gate 152, and a source connected to the select gate line SWG (i+1), as shown in FIG. 6.

(Layout Block Configuration Example 2)

Figure 7:
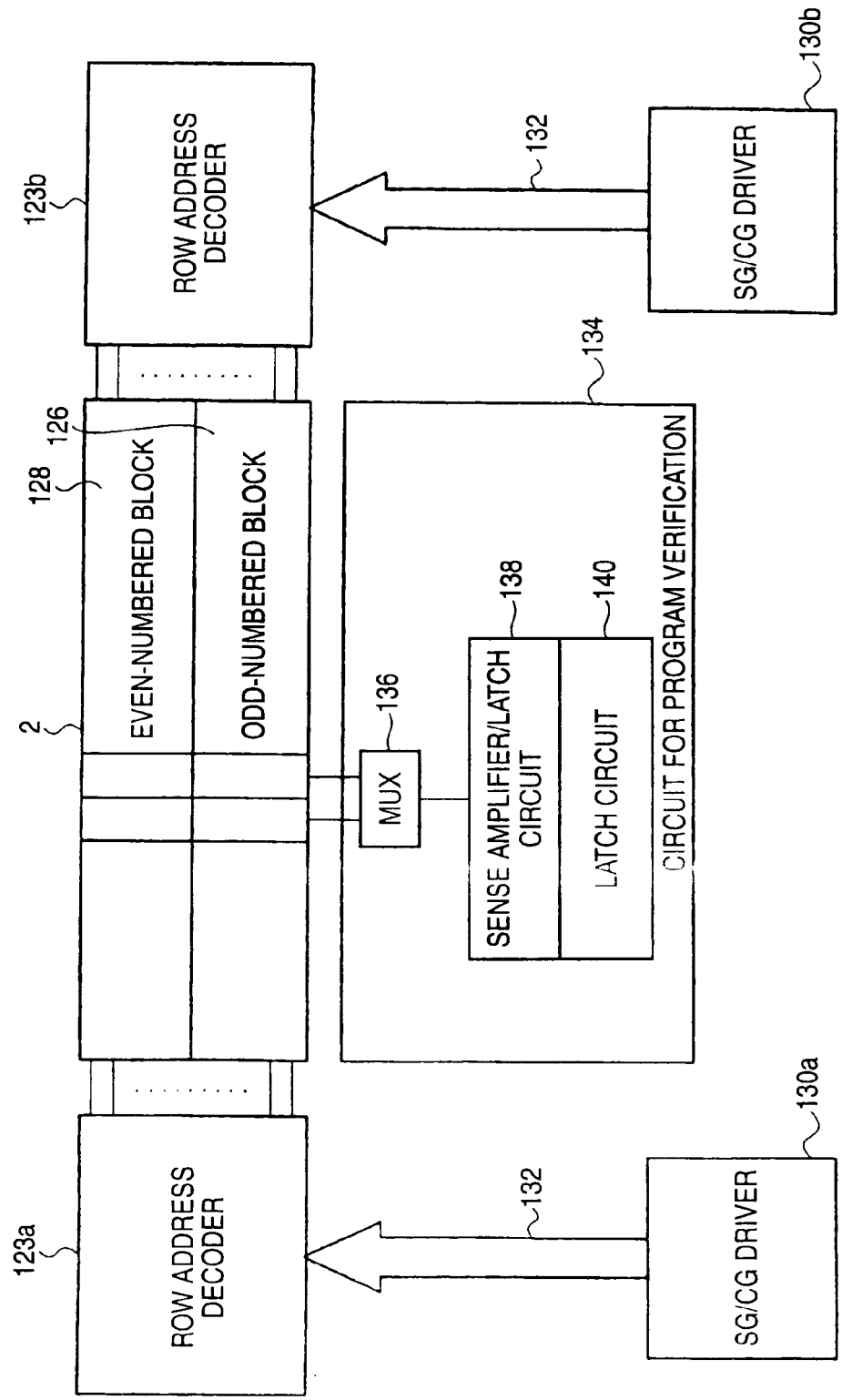
FIG. 7 is an exemplary block diagram to show a second layout block configuration example of the nonvolatile semiconductor memory according to the first embodiment of the invention.

In the nonvolatile semiconductor memory according to the first embodiment of the invention, a second layout block configuration example includes a memory cell array 2 divided into an odd-numbered block 126 and an even-numbered block 128, row address decoders 123*a* and 123*b* connected to the memory cell array 2, a verifying circuit 134 containing a multiplexer 136 connected to bit lines BL of the memory cell array 2, a sense amplifier/latch circuit 138 and a latch circuit 140 connected to the multiplexer 136, a data register 118, a column address decoder 4, and other circuits, an SG/CG driver 130*a* connected to the row address decoder 123*a* through a bus 132, and an SG/CG driver 130*b* connected to the row address decoder 123*b* through a bus 132, as shown in FIG. 7. A bit line BL not connected to a sense amplifier 120 serves as a shield line.

(Layout Circuit Configuration Example 2)

Figure 8:
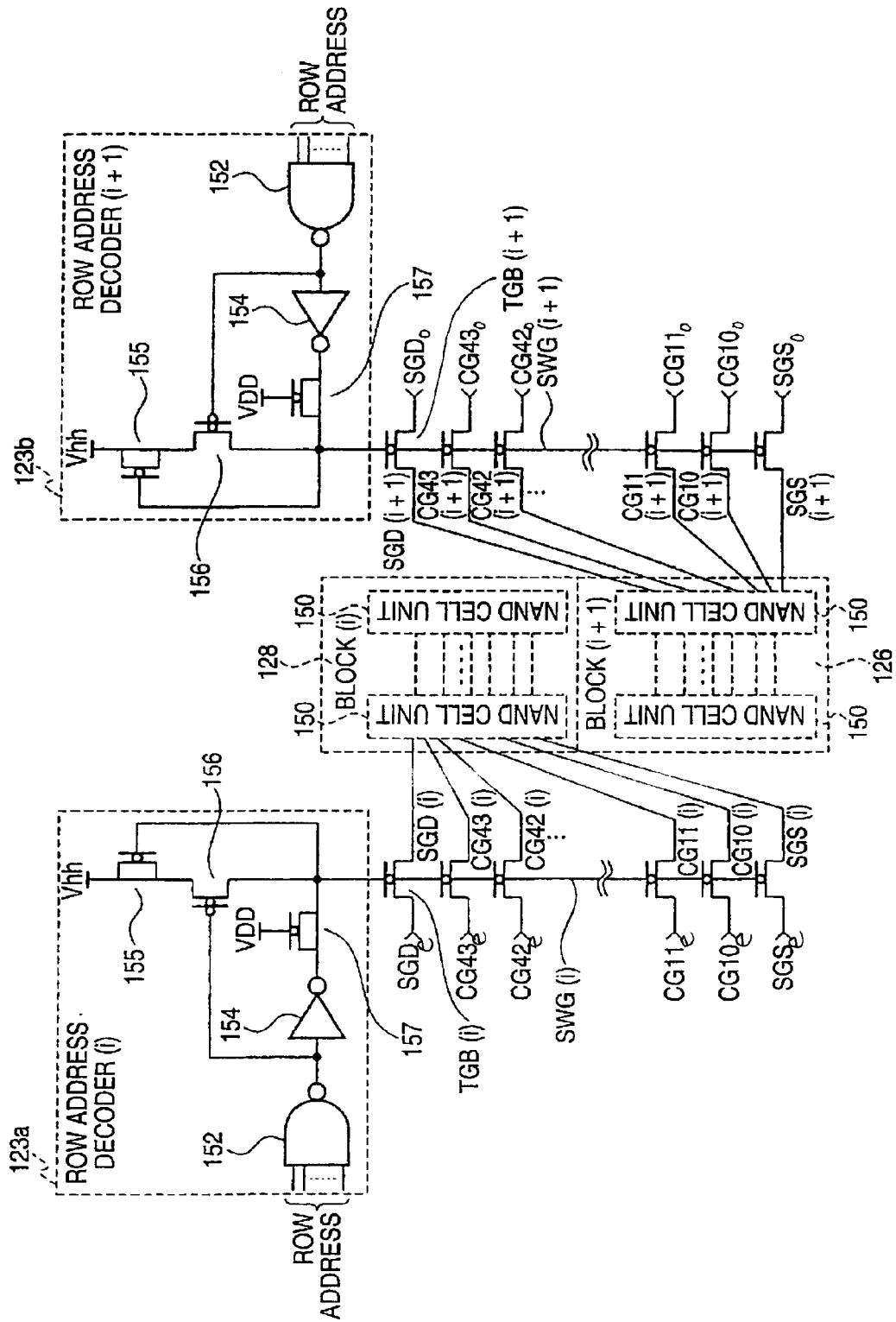
FIG. 8 is an exemplary circuit diagram corresponding to the second layout block configuration example of the nonvolatile semiconductor memory according to the first embodiment of the invention.

The circuit configuration corresponding to the second layout block configuration example of the nonvolatile semiconductor memory according to the first embodiment of the invention includes an even-numbered block 128 having a plurality of NAND cell units 150 placed in parallel in a row direction, an odd-numbered block 126 having a plurality of NAND cell units 150 placed in parallel in the row direction, block selection transistors TGB (i) for selecting a bit line side select gate line SGD (i), a source line side select gate line SGS (i), and word lines CG10 (i), CG11 (i), . . . , CG42 (i), CG 43 (i) connected to the even-numbered block 128, block selection transistors TGB (i+1) for selecting a bit line side select gate line SGD (i+1), a source line side select gate line SGS (i+1), and word lines CG10 (i+1), CG11 (i+1), . . . , CG42 (i+1), CG 43 (i+1) connected to the odd-numbered block 126, a row address decoder 123*a* for supplying a row address decode signal to a select gate line SWG (i) connected to gates of the block selection transistors TGB (i) in common, and a row address decoder 123*b* for supplying a row address decode signal to a select gate line SWG (i+1) connected to gates of the block selection transistors TGB (i+1) in common, as shown in FIG. 8.

The row address decoder 123*a* includes an NAND gate 152 for inputting a row address signal, an inverter 154 connected to output of the NAND gate 152, a transfer MOS transistor 157 connected to output of the inverter 154 and having a gate connected to power supply voltage VDD (power supply voltage generated from supplied power supply voltage VCC in the chip or supplied power supply voltage VCC depending on the specifications) and a source connected to the select gate line SWG (i), a transfer MOS transistor 155 having a drain connected to power supply voltage Vhh generated from supplied power supply voltage VCC or VDD in the chip and a gate connected to the select gate line SWG (i), and a MOS transistor 156 having a drain connected to the source of the MOS transistor 155, a gate connected to the output of the NAND gate 152, and a source connected to the select gate line SWG (i), as shown in FIG. 8.

Likewise, the row address decoder 123*b* includes an NAND gate 152 for inputting a row address signal, an inverter 154 connected to output of the NAND gate 152, a transfer MOS transistor 157 connected to output of the inverter 154 and having a gate connected to power supply voltage VDD and a source connected to the select gate line SWG (i+1), a transfer MOS transistor 155 having a drain connected to power supply voltage Vhh and a gate connected to the select gate line SWG (i+1), and a MOS transistor 156 having a drain connected to the source of the MOS transistor 155, a gate connected to the output of the NAND gate 152, and a source connected to the select gate line SWG (i+1), as shown in FIG. 8.

(Layout Block Configuration Example 3)

Figure 9:
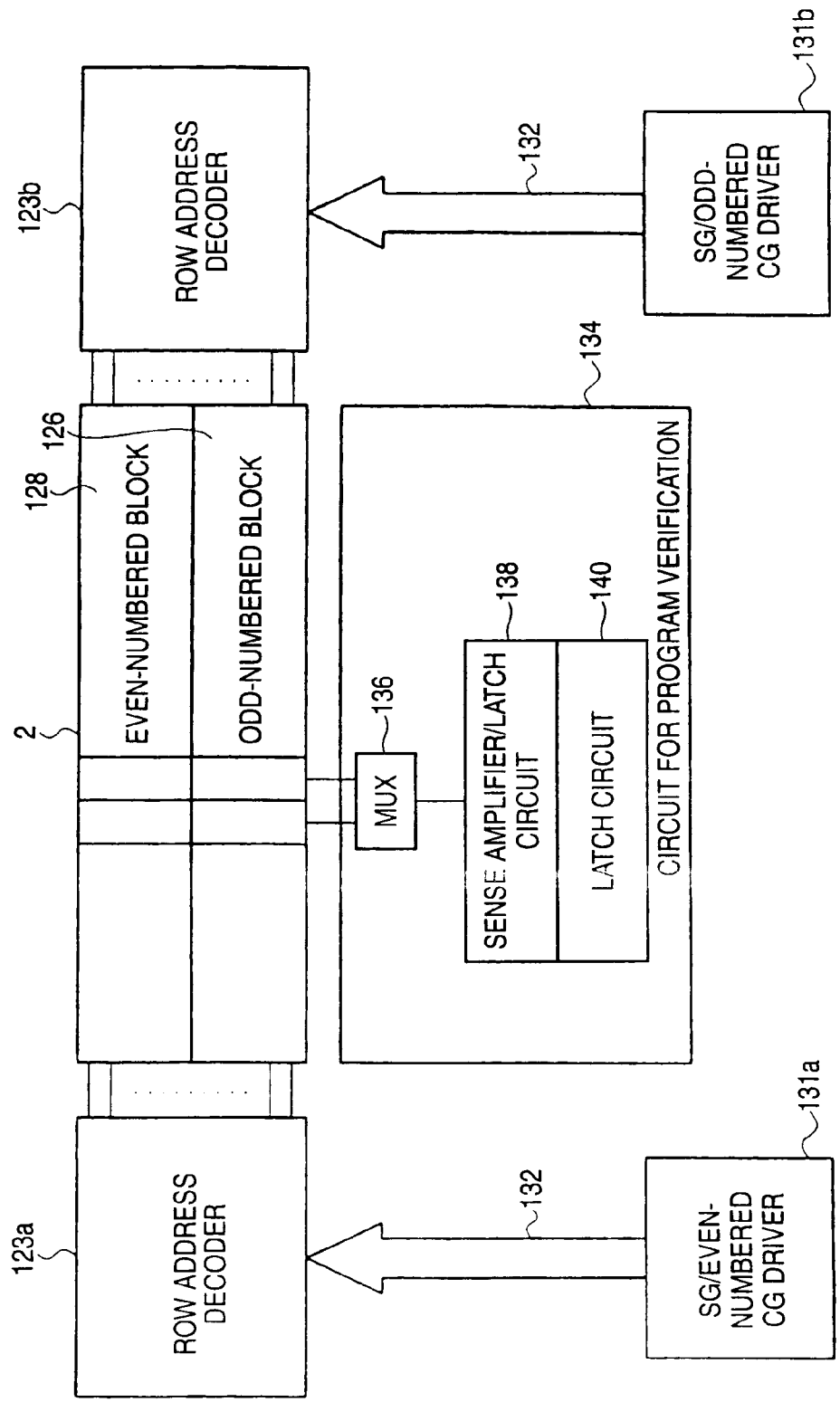
FIG. 9 is an exemplary block diagram to show a third layout block configuration example of the nonvolatile semiconductor memory according to the first embodiment of the invention.

In the nonvolatile semiconductor memory according to the first embodiment of the invention, a third layout block configuration example includes a memory cell array 2 divided into an odd-numbered block 126 and an even-numbered block 128, row address decoders 123*a* and 123*b* connected to the memory cell array 2, a verifying circuit 134 containing a multiplexer 136 connected to bit lines BL of the memory cell array 2, a sense amplifier/latch circuit 138 and a latch circuit 140 connected to the multiplexer 136, a data register 118, a column address decoder 4, and other circuits, an SG/even-numbered CG driver 131*a* connected to the row address decoder 123*a* through a bus 132, and an SG/odd-numbered CG driver 131*b* connected to the row address decoder 123*b* through a bus 132, as shown in FIG. 9. A bit line BL not connected to a sense amplifier 120 serves as a shield line.

(Layout Circuit Configuration Example 3)

Figure 10:
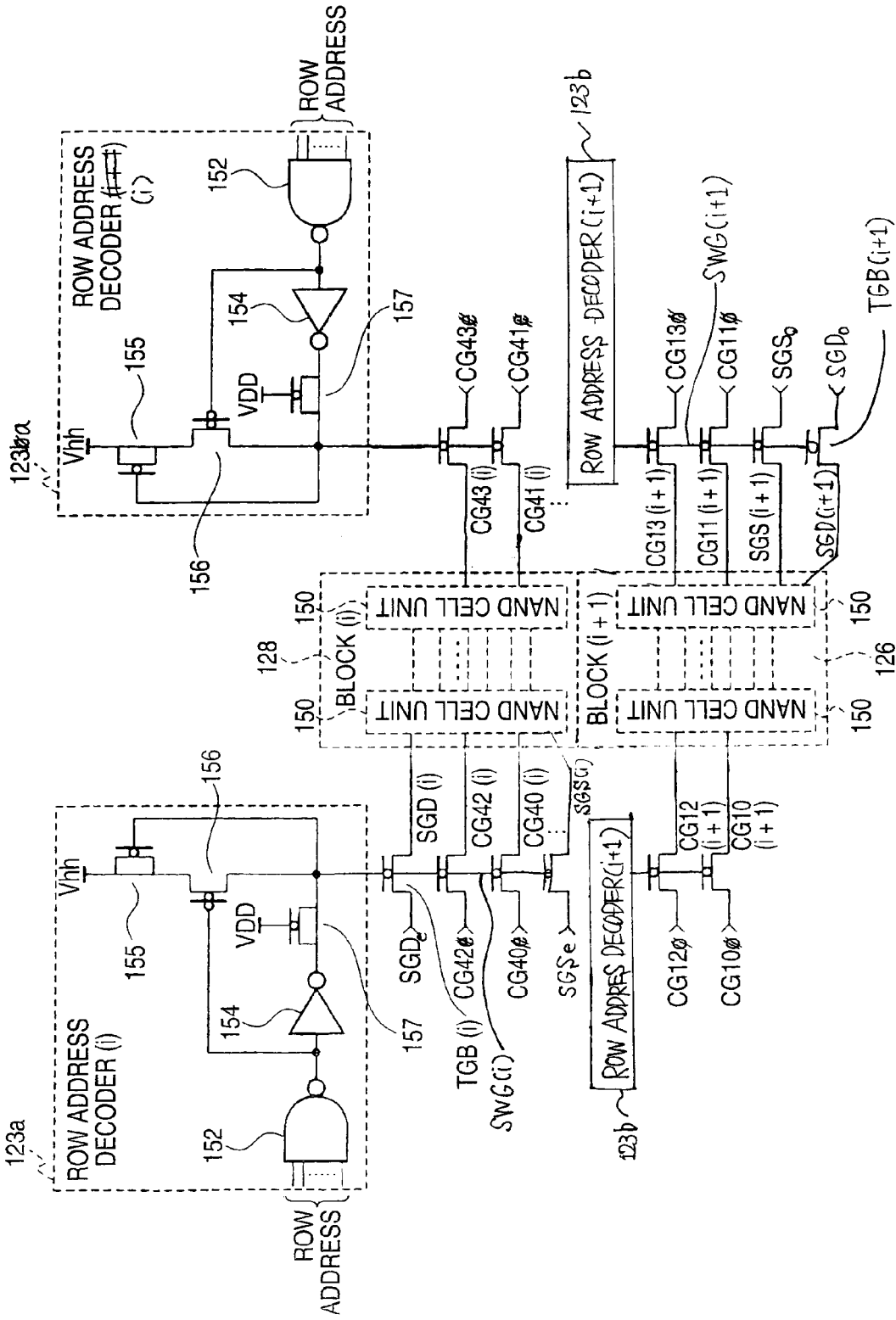
FIG. 10 is an exemplary circuit diagram corresponding to the third layout block configuration example of the nonvolatile semiconductor memory according to the first embodiment of the invention.

The circuit configuration corresponding to the third layout block configuration example of the nonvolatile semiconductor memory according to the first embodiment of the invention includes an even-numbered block 128 having a plurality of NAND cell units 150 placed in parallel in a row direction, an odd-numbered block 126 having a plurality of NAND cell units 150 placed in parallel in the row direction, block selection transistors TGB (i) for selecting a bit line side select gate line SGD (i), a source line side select gate line SGS (i), and even-numbered word lines CG10 (i), CG12 (i), . . . , CG40 (i), CG 42 (i) connected to the even-numbered block 128, and odd-numbered word lines CG10 (i+1), CG12 (i+1), . . . , CG40 (i+1), CG 42 (i+1) connected to the odd-numbered block 126, block selection transistors TGB (i+1) for selecting a bit line side select gate line SGD (i+1), a source line side select gate line SGS (i+1), and odd-numbered word lines CG11 (i+1), CG13 (i+1), . . . , CG41 (i+1), CG 43 (i+1) connected to the odd-numbered block 126, and even-numbered word lines CG11 (i), CG13 (i), . . . , CG41 (i), CG 43 (i) connected to the even-numbered block 128, a row address decoder 123*a* for supplying a row address decode signal to a select gate line SWG (i) connected to gates of the block selection transistors TGB (i) in common, and a row address decoder 123*b* for supplying a row address decode signal to a select gate line SWG (i+1) connected to gates of the block selection transistors TGB (i+1) in common, as shown in FIG. 10.

The row address decoder 123*a* includes an NAND gate 152 for inputting a row address signal, an inverter 154 connected to output of the NAND gate 152, a transfer MOS transistor 157 connected to output of the inverter 154 and having a gate connected to power supply voltage VDD (power supply voltage generated from supplied power supply voltage VCC in the chip or supplied power supply voltage VCC depending on the specifications) and a source connected to the select gate line SWG (i), a transfer MOS transistor 155 having a drain connected to power supply voltage Vhh generated from supplied power supply voltage VCC or VDD in the chip and a gate connected to the select gate line SWG (i), and a MOS transistor 156 having a drain connected to the source of the MOS transistor 155, a gate connected to the output of the NAND gate 152, and a source connected to the select gate line SWG (i), as shown in FIG. 10.

Likewise, the row address decoder 123*b* includes an NAND gate 152 for inputting a row address signal, an inverter 154 connected to output of the NAND gate 152, a transfer MOS transistor 157 connected to output of the inverter 154 and having a gate connected to power supply voltage VDD and a source connected to the select gate line SWG (i+1), a transfer MOS transistor 155 having a drain connected to power supply voltage Vhh and a gate connected to the select gate line SWG (i+1), and a MOS transistor 156 having a drain connected to the source of the MOS transistor 155, a gate connected to the output of the NAND gate 152, and a source connected to the select gate line SWG (i+1), as shown in FIG. 10.

(Layout Block Configuration Example 4)

Figure 11:
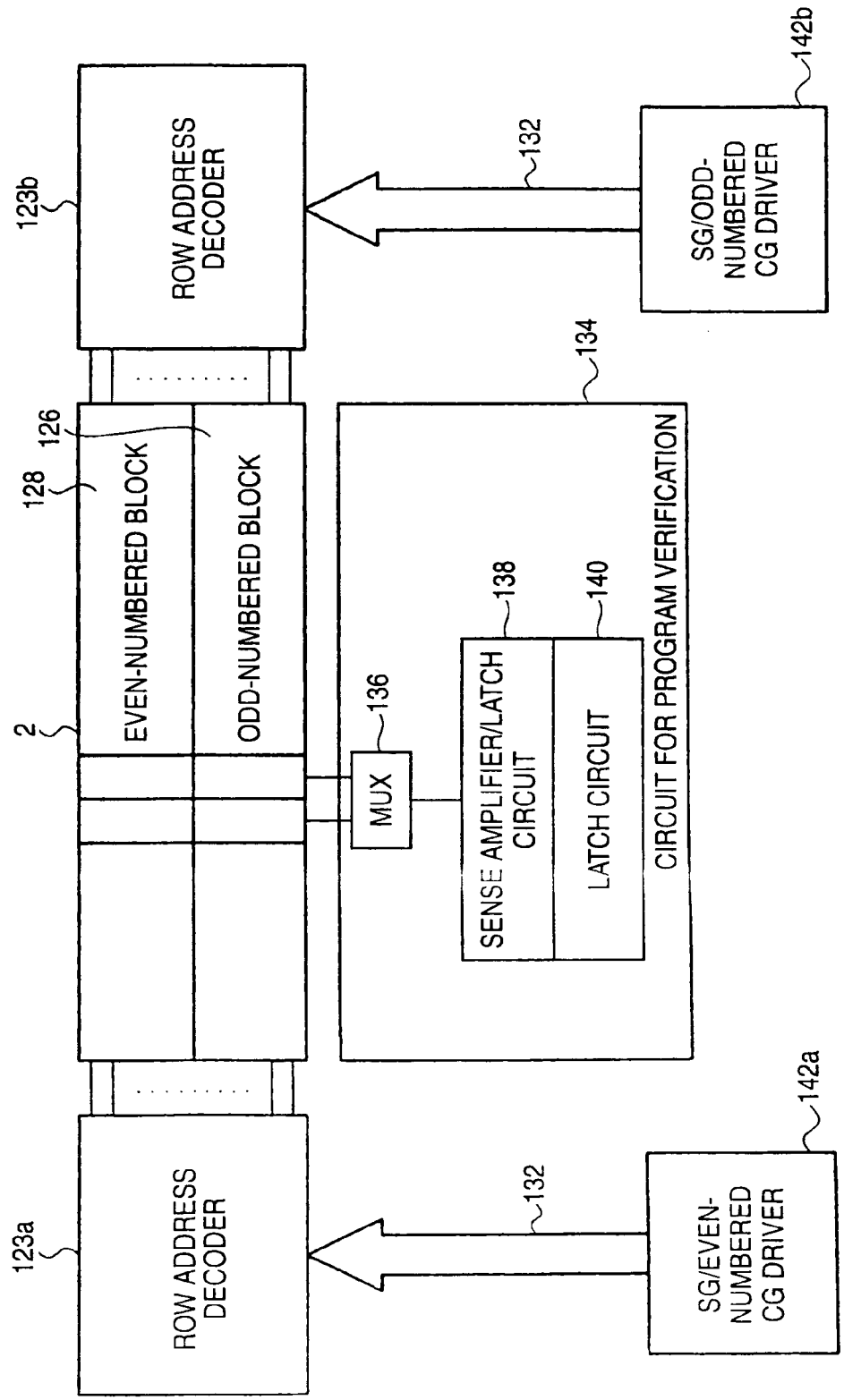
FIG. 11 is an exemplary block diagram to show a fourth layout block configuration example of the nonvolatile semiconductor memory according to the first embodiment of the invention.

In the nonvolatile semiconductor memory according to the first embodiment of the invention, a fourth layout block configuration example includes a memory cell array 2 divided into an odd-numbered block 126 and an even-numbered block 128, row address decoders 123a and 123b connected to the memory cell array 2, a verifying circuit 134 containing a multiplexer 136 connected to bit lines BL of the memory cell array 2, a sense amplifier/latch circuit 138 and a latch circuit 140 connected to the multiplexer 136, a data register 118, a column address decoder 4, and other circuits, an SGD/even-numbered CG driver 142a connected to the row address decoder 123a through a bus 132, and an SGS/odd-numbered CG driver 142b connected to the row address decoder 123b through a bus 132, as shown in FIG. 11. A bit line BL not connected to a sense amplifier 120 serves as a shield line.

(Layout Circuit Configuration Example 4)

Figure 12:
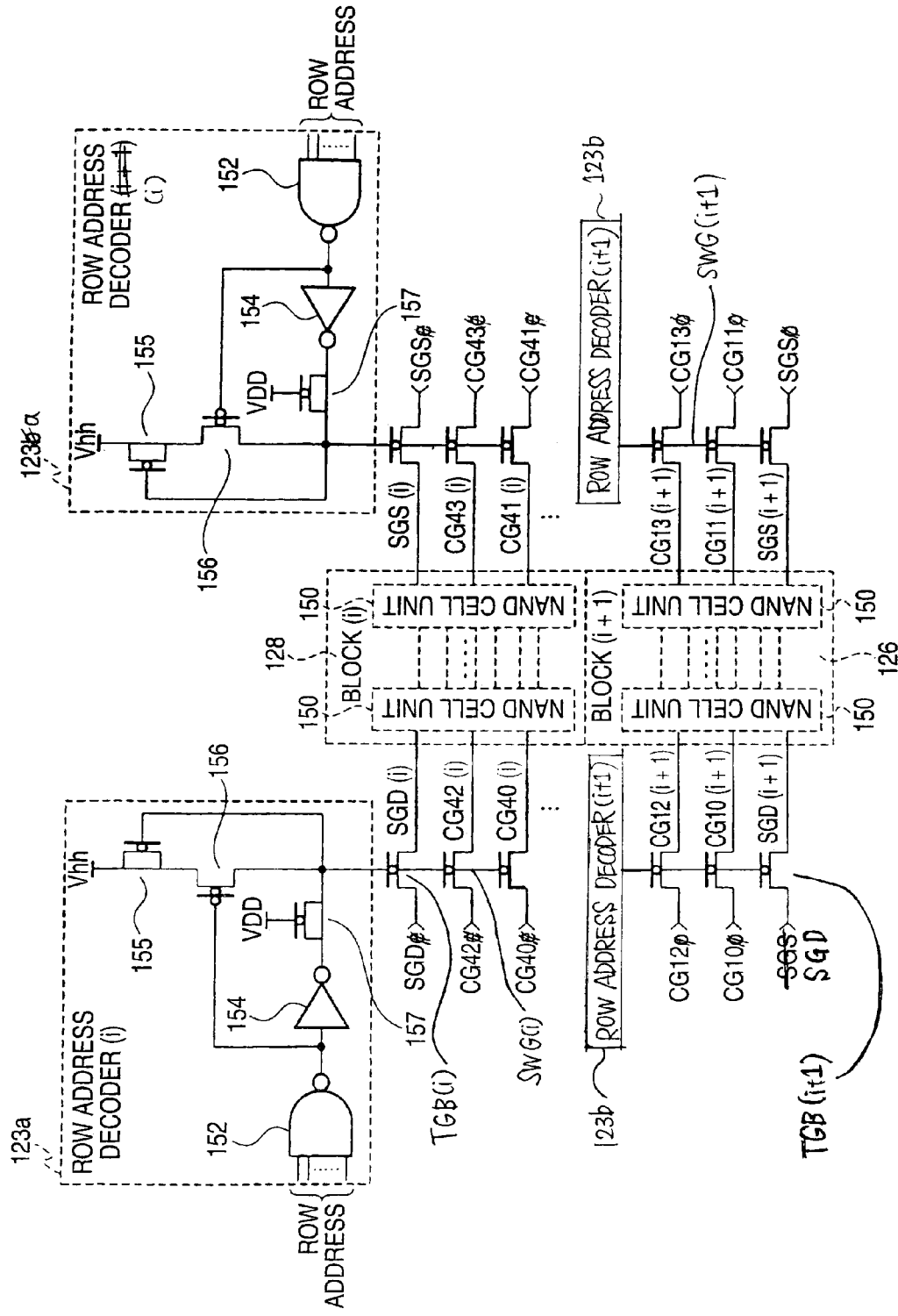
FIG. 12 is an exemplary circuit diagram corresponding to the fourth layout block configuration example of the nonvolatile semiconductor memory according to the first embodiment of the invention.

The circuit configuration corresponding to the fourth layout block configuration example of the nonvolatile semiconductor memory according to the first embodiment of the invention includes an even-numbered block 128 having a plurality of NAND cell units 150 placed in parallel in a row direction, an odd-numbered block 126 having a plurality of NAND cell units 150 placed in parallel in the row direction, block selection transistors TGB (i) for selecting a bit line side select gate line SGD (i) and even-numbered word lines CG10 (i), CG12 (i), . . . , CG40 (i), CG 42 (i) connected to the even-numbered block 128, and a bit line side select gate line SGD (i+1) and odd-numbered word lines CG10 (i+1), CG12 (i+1), . . . , CG40 (i+1), CG 42 (i+1) connected to the odd-numbered block 126, block selection transistors TGB (i+1) for selecting a source line side select gate line SGD (i) and even-numbered word lines CG11 (i), CG13 (i), . . . , CG41 (i), CG 43 (i) connected to the even-numbered block 128, and a source line side select gate line SGS (i+1) and odd-numbered word lines CG11 (i+1), CG13 (i+1), . . . , CG41 (i+1), CG 43 (i+1) connected to the odd-numbered block 126, and even-numbered word lines CG11 (i), CG13 (i), . . . , CG41 (i), CG 43 (i) connected to the even-numbered block 128, a row address decoder 123a for supplying a row address decode signal to a select gate line SWG (i) connected to gates of the block selection transistors TGB (i) in common, and a row address decoder 123b for supplying a row address decode signal to a select gate line SWG (i+1) connected to gates of the block selection transistors TGB (i+1) in common, as shown in FIG. 12.

The row address decoder 123a includes an NAND gate 152 for inputting a row address signal, an inverter 154 connected to output of the NAND gate 152, a transfer MOS transistor 157 connected to output of the inverter 154 and having a gate connected to power supply voltage VDD (power supply voltage generated from supplied power supply voltage VCC in the chip or supplied power supply voltage VCC depending on the specifications) and a source connected to the select gate line SWG (i), a transfer MOS transistor 155 having a drain connected to power supply voltage Vhh generated from supplied power supply voltage VCC or VDD in the chip and a gate connected to the select gate line SWG (i), and a MOS transistor 156 having a drain connected to the source of the MOS transistor 155, a gate connected to the output of the NAND gate 152, and a source connected to the select gate line SWG (i), as shown in FIG. 12.

Likewise, the row address decoder 123b includes an NAND gate 152 for inputting a row address signal, an inverter 154 connected to output of the NAND gate 152, a transfer MOS transistor 157 connected to output of the inverter 154 and having a gate connected to power supply voltage VDD and a source connected to the select gate line SWG (i+1), a transfer MOS transistor 155 having a drain connected to power supply voltage Vhh and a gate connected to the select gate line SWG (i+1), and a MOS transistor 156 having a drain connected to the source of the MOS transistor 155, a gate connected to the output of the NAND gate 152, and a source connected to the select gate line SWG (i+1), as shown in FIG. 12.

(Device Structure)

In the nonvolatile semiconductor memory according to the first embodiment of the invention, the memory cell transistors M10, M11, . . . , M42, and M43 are stacked for providing a large memory capacity. However, the cutoff characteristic of the source line side selection gate transistor TGS and the bit line side selection gate transistor TGD is important for accomplishing "1" write (holding an erased state) by self-boost. Therefore, it is desirable that the source line side selection gate transistor TGS and the bit line side selection gate transistor TGD should be created on the surface of a semiconductor substrate 10 for providing a good cutoff characteristic. The semiconductor substrate 10 may be a bulk semiconductor or a well diffusion region may be included on the semiconductor substrate.

The memory cell transistors M10, M11, . . . , M42, and M43 formed as a stack in an interlayer insulating film 34 are formed of thin film transistors (TFT). Using a laser annealing technique, etc., deposited amorphous silicon or polysilicon can be recrystallized for forming source/drain regions 26 and channel regions 25 of the memory cell transistors M10, M11, . . . , M42, and M43 or deposited amorphous silicon or polysilicon can be used intact for forming source/drain regions 26 and channel regions 25 of the memory cell transistors M10, M11, . . . , M42, and M43; if the gate structure of the memory cell transistor M10, M11, . . . , M42, M43 is an ONO structure, electrons or holes may be stored at trap levels or if the gate structure is a floating gate structure, electrons or holes may be stored in a floating gate electrode layer and a threshold value may change.

In the description to follow, a TFT of a SONOS structure as a memory cell transistor is taken as an example, but if a nonvolatile semiconductor memory has TFTs of a stack gate structure, the transistors can also be formed as a stack in a similar manner.

Figure 13:
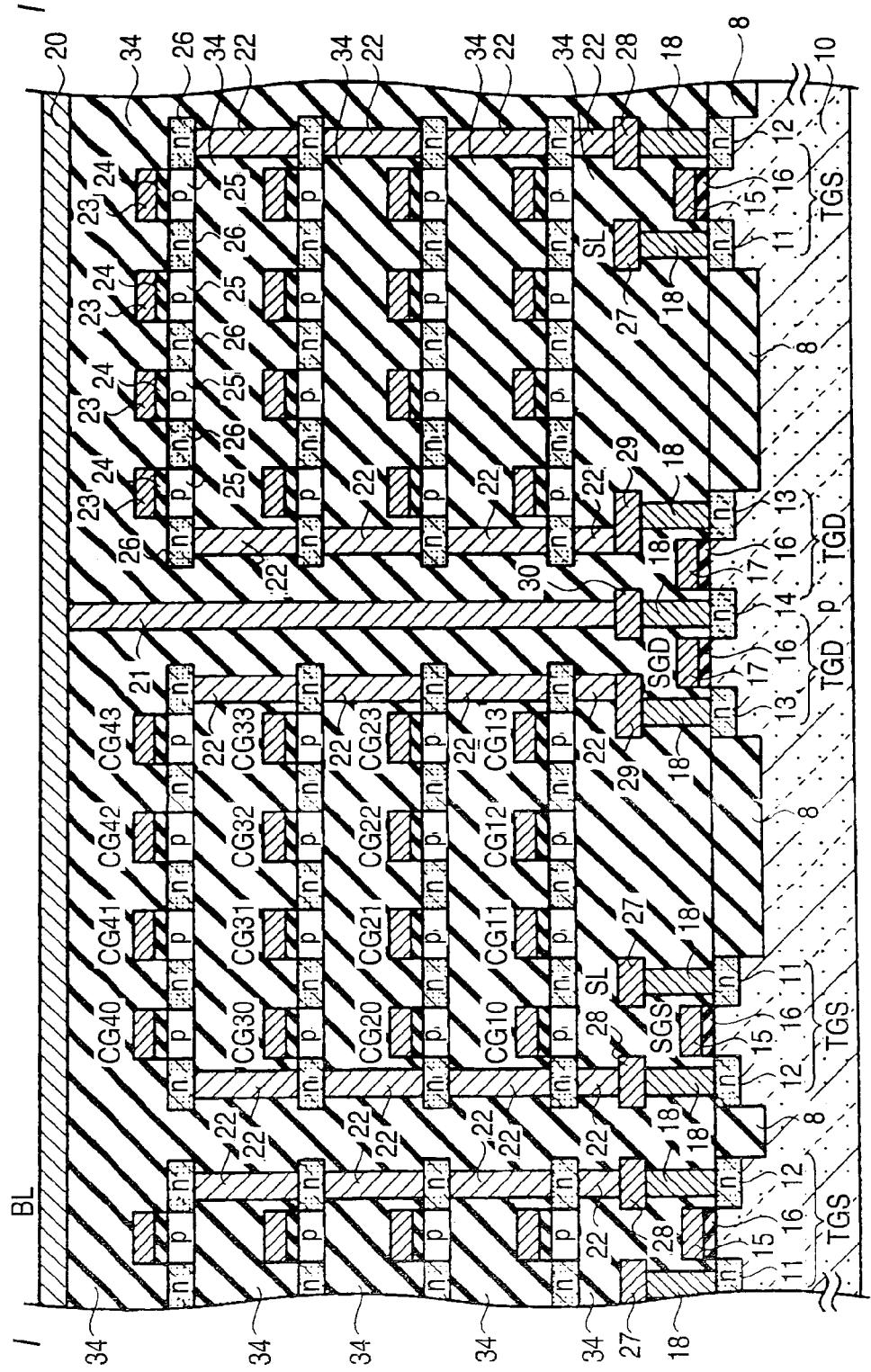
FIG. 13 is an exemplary drawing to show the schematic sectional structure of a NAND cell unit using a SONOS/TFT structure for memory cell transistors in a bit line extension direction taken on line I-I, of the nonvolatile semiconductor memory according to the first embodiment of the invention.

In the nonvolatile semiconductor memory according to the first embodiment of the invention, the case where memory cell transistors are stacked as four layers is taken as an example, as shown in FIG. 13. The positional relationship between channel region 25 and control gate electrode 23 may be changed although not shown in the figure. In the example shown in FIG. 13, amorphous silicon or polysilicon is used for source/drain region and channel region 25.

Although the gate structure of a memory cell transistor is a SONOS structure, when amorphous silicon or polysilicon is used, a nitride film may be placed as a surface layer of an insulating film to suppress dangling bond. Therefore, an SNONONS structure may be adopted. A SANOS structure of using an alumina film (Al$_2$O$_3$) with a large dielectric constant in place of a silicon oxide film on the control gate side may be adopted. A MONOS structure or a MANOS structure of using metal for a control gate may be adopted.

Although it is assumed that the TFT applied as a memory cell transistor is n-channel type, it may be p-channel type.

Each memory cell transistor applied to the nonvolatile semiconductor memory according to the first embodiment of the invention is placed in an interlayer insulating film 34 stacked on a semiconductor substrate 10 and includes a SONOS structure made up of source/drain regions 26, a channel region 25 between the source/drain regions 26, an ONO insulating film 24 placed on the channel region 25, and a control gate electrode 23 placed on the ONO insulating film 24, as shown in FIG. 13.

The schematic sectional structure of each NAND cell unit using SONOS transistors as memory cell transistors, of the nonvolatile semiconductor memory according to the first embodiment of the invention includes a semiconductor substrate 10, field isolation regions (STI) 8 placed in the semiconductor substrate 10, source/drain regions 13 an 14 of a bit line side selection gate transistor TGD placed in the semiconductor substrate 10 sandwiched between the field isolation regions 8, source/drain regions 11 and 12 of a source line side selection gate transistor TGS placed in the semiconductor substrate 10 sandwiched between the field isolation regions (STI) 8, a gate insulating film 16 placed on the semiconductor substrate 10 between the source/drain regions 13 and 14, a select gate line (SGD) 17 placed on the gate insulating film 16, a gate insulating film 16 placed on the semiconductor substrate 10 between the source/drain regions 11 and 12, a select gate line (SGS) 15 placed on the gate insulating film 16, contact plugs 18 placed on the source/drain regions 11, 12, 13, and 14, metal wiring layers 27, 28, 29, and 30 connected through the source/drain regions 11, 12, 13, and 14 and the contact plugs 18, a first memory cell string made up of memory cell transistors M10, M11, M12, and M13 of an SONOS structure stacked on the metal wiring layers 27, 28, 29, and 30 through an interlayer insulting film 34 and connected in series through source/drain regions 26 and contact plugs 22 between the metal wiring layers 28 and 29, a second memory cell string made up of memory cell transistors M20, M21, M22, and M23 of an SONOS structure stacked on the memory cell transistors M10, M11, M12, and M13 through an interlayer insulting film 34, connected in parallel with the first memory cell string, and connected in series through source/drain regions 26, channel regions 25, and contact plugs 22, a third memory cell string made up of memory cell transistors M30, M31, M32, and M33 of an SONOS structure stacked on the memory cell transistors M20, M21, M22, and M23 through an interlayer insulting film 34, connected in parallel with the first and second memory cell strings, and connected in series through source/drain regions 26, channel regions 25, and contact plugs 22, a fourth memory cell string made up of memory cell transistors M40, M41, M42, and M43 of an SONOS structure stacked on the memory cell transistors M30, M31, M32, and M33 through an interlayer insulating film 34, connected in parallel with the first to third memory cell strings, and connected in series through source/drain regions 26 and contact plugs 22, a source line SL connected to the metal wiring layer 27, and a bit line 20 connected to the metal wiring layer 30 through a contact plug 21, as shown in FIG. 13.

(Planar Pattern Configuration)

The schematic planar pattern configuration of the NAND cell unit 150 using SONOS transistors as memory cell transistors, of the nonvolatile semiconductor memory according to the first embodiment of the invention includes a NAND cell part plain 32 of a fourth layer as shown in FIG. 14(a), a NAND cell part plain 32 of a third layer as shown in FIG. 14(b), a NAND cell part plain 32 of a second layer as shown in FIG. 14(c), a NAND cell part plain 32 of a first layer as shown in FIG. 14(d), and a select gate part plain 33 as shown in FIG. 14(e).

In the NAND cell part plain 32 of the fourth layer, a pattern of the source/drain regions 26 and the control gate electrodes 23 of the SONOS transistors is placed continuously and the NAND cell part plain 32 is connected at one end to the bit line side selection gate transistor TGD for connection to the bit line 20 through the contact plug 21, as shown in FIG. 14(a).

In the NAND cell part plain 32 of the third layer, a pattern of the source/drain regions 26 and the control gate electrodes 23 of the SONOS transistors is placed continuously and the NAND cell part plain 32 is connected at one end to the bit line side selection gate transistor TGD for connection to the bit line 20 through the contact plug 21, as shown in FIG. 14(b).

In the NAND cell part plain 32 of the second layer, a pattern of the source/drain regions 26 and the control gate electrodes 23 of the SONOS transistors is placed continuously and the NAND cell part plain 32 is connected at one end to the bit line side selection gate transistor TGD for connection to the bit line 20 through the contact plug 21, as shown in FIG. 14(c).

In the NAND cell part plain 32 of the first layer, a pattern of the source/drain regions 26 and the control gate electrodes 23 of the SONOS transistors is placed continuously and the NAND cell part plain 32 is connected at one end to the bit line side selection gate transistor TGD for connection to the bit line 20 through the contact plug 21, as shown in FIG. 14(d).

In the select gate part plain 33, a pattern of the source line SL made up of the metal wiring layer 28 connected to the drain region 12 of the source line side selection gate transistor TGS, the select gate line (SGS) 15, and the metal wiring layer 27 connected to the source region 11 of the source line side selection gate transistor TGS and a pattern of the metal wiring layer 30 connected to the drain region 14 of the bit line side selection gate transistor TGD, the select gate line (SGD) 17, and the metal wiring layer 29 connected to the source region 13 of the bit line side selection gate transistor TGD are placed, as shown in FIG. 14(e).

Figure 14:
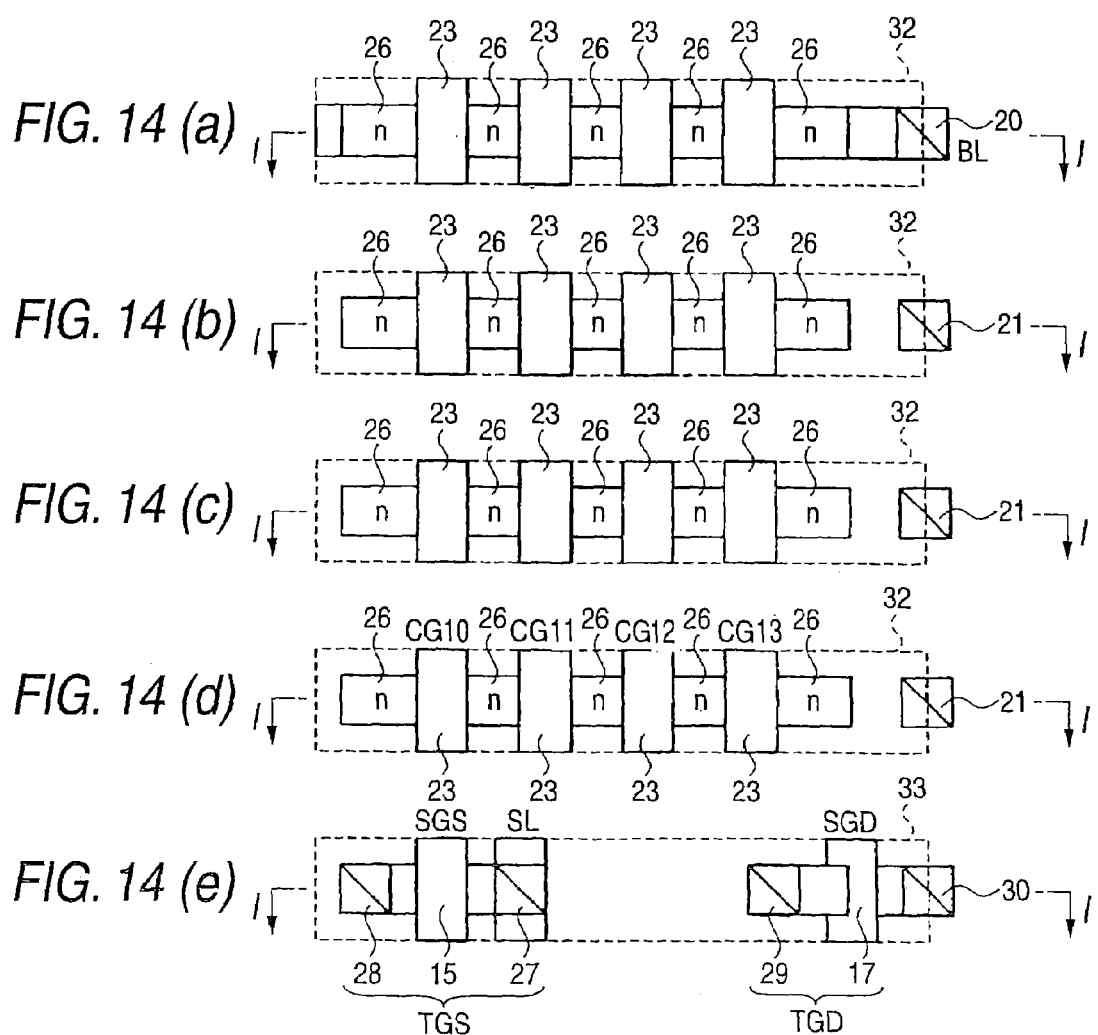
FIG. 14 shows the schematic planar pattern configuration of the nonvolatile semiconductor memory according to the first embodiment of the invention.

In the nonvolatile semiconductor memory according to the first embodiment of the invention, the source line side selection gate transistor TGS can fold in the lower part of the stacked NAND cell unit 150 as shown in FIGS. 13 and 14 and thus the planar size is reduced as much as the placement space of the source line side selection gate transistor TGS.

(Operation Voltage Example)

An operation voltage example of the NAND cell unit using SONOS transistors as memory cell transistors, of the nonvolatile semiconductor memory according to the first embodiment of the invention is represented as shown in FIG. 15.

FIG. 15 shows the pulse voltage state for each of source line SL, bit line BL, select gate lines SGS and SGD, selected word line CG, unselected word line CG of the same layer, and unselected word line CG of a different layer in each of the operation modes of read mode, "0" write mode, "1" write mode, and erase mode for a selected block. Likewise, it also shows the pulse voltage state for each of source line SL, bit line BL, select gate lines SGS and SGD, and word line CG in each of the operation modes of read mode, "0" write mode, "1" write mode, and erase mode for an unselected block. In FIG. 15, VDD denotes power supply potential, VSS denotes ground potential, VRR denotes read voltage, VNN denotes unselected cell read voltage, VPP denotes write voltage, VEE denotes erase voltage, VMM denotes bootstrap voltage, and VXX denotes pulse voltage applied to selected word line CG. The voltage of VRR is set higher than the maximum threshold voltage of '0' data written cells and the voltage of VNN is lower than the minimum threshold voltage of '1' data written cells.

Figure 16:
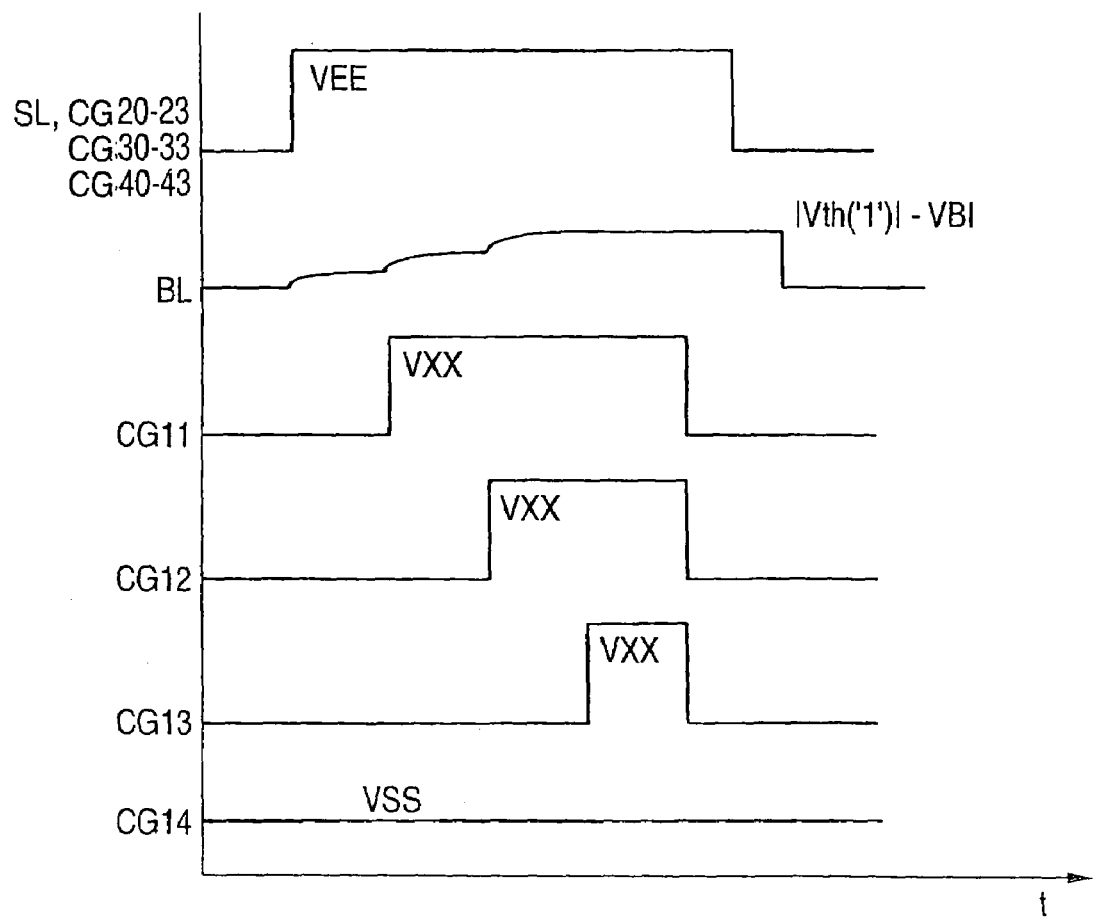
FIG. 16 is an exemplary drawing to show operation waveforms in erase operation according to FIG. 15, of the nonvolatile semiconductor memory according to the first embodiment of the invention.

Operation waveforms in the erase operation according to FIG. 15 are represented as shown in FIG. 16. In FIG. 16, VBI denotes the built-in potential of p-n junction and Vth ('1') denotes threshold voltage in '1' written state. FIG. 16 shows pulse voltage states applied to the source line SL, the word lines CG20 to CG23, CG30 to CG33, and CG40 to CG43, the bit line BL, and the word lines CG10, CG11, CG12, and CG13. As shown in FIG. 16, the potential of the bit line BL is represented as |Vth ('1')|−VBI and the intermediate waveform varies depending on the threshold value of each memory cell transistor.

Figure 17:
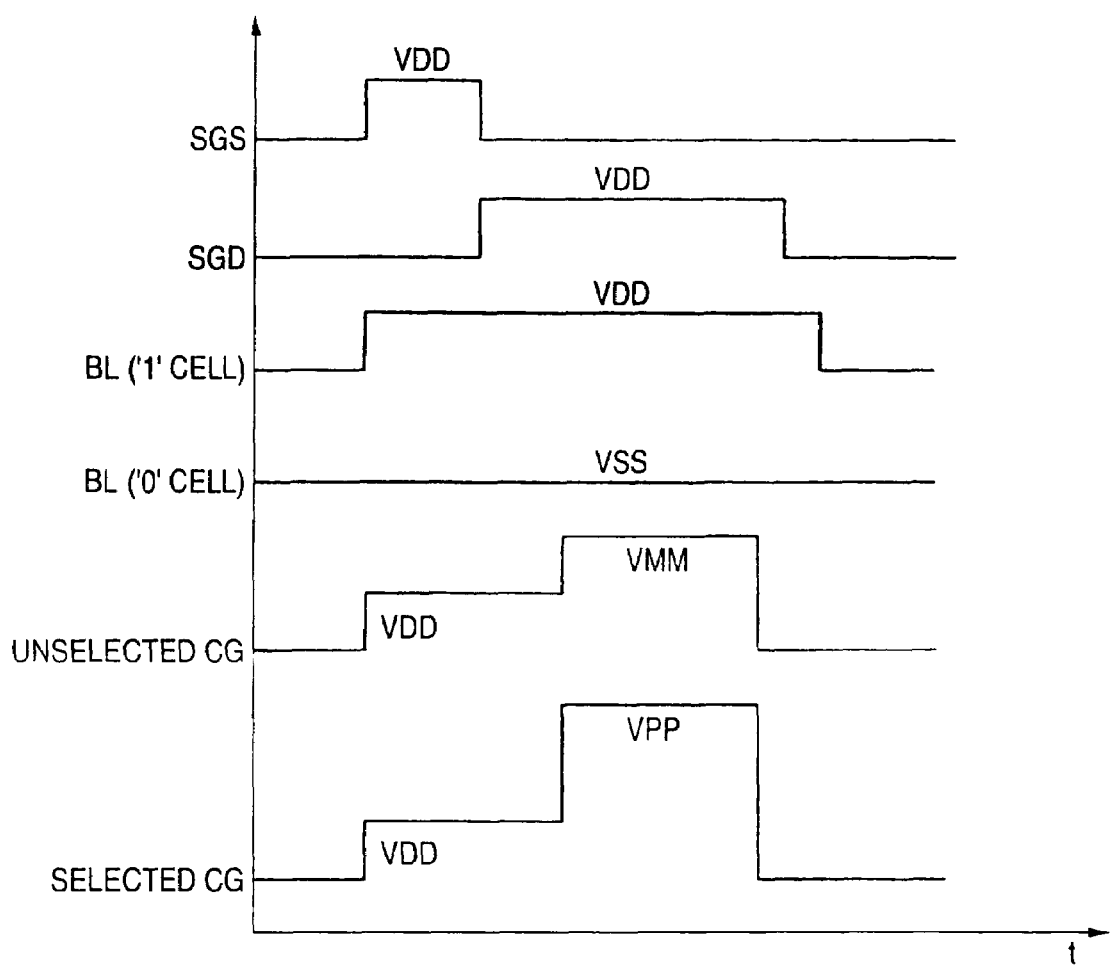
FIG. 17 is an exemplary drawing to show operation waveforms in write operation according to FIG. 15, of the nonvolatile semiconductor memory according to the first embodiment of the invention.

Operation waveforms in the write operation according to FIG. 15 are represented as shown in FIG. 17. FIG. 17 shows pulse voltage states applied to the select gate lines SGS and SGD, the bit line BL of '1' write cell, the bit line BL of '0' write cell, unselected word line CG, and selected word line CG.

Figure 18:
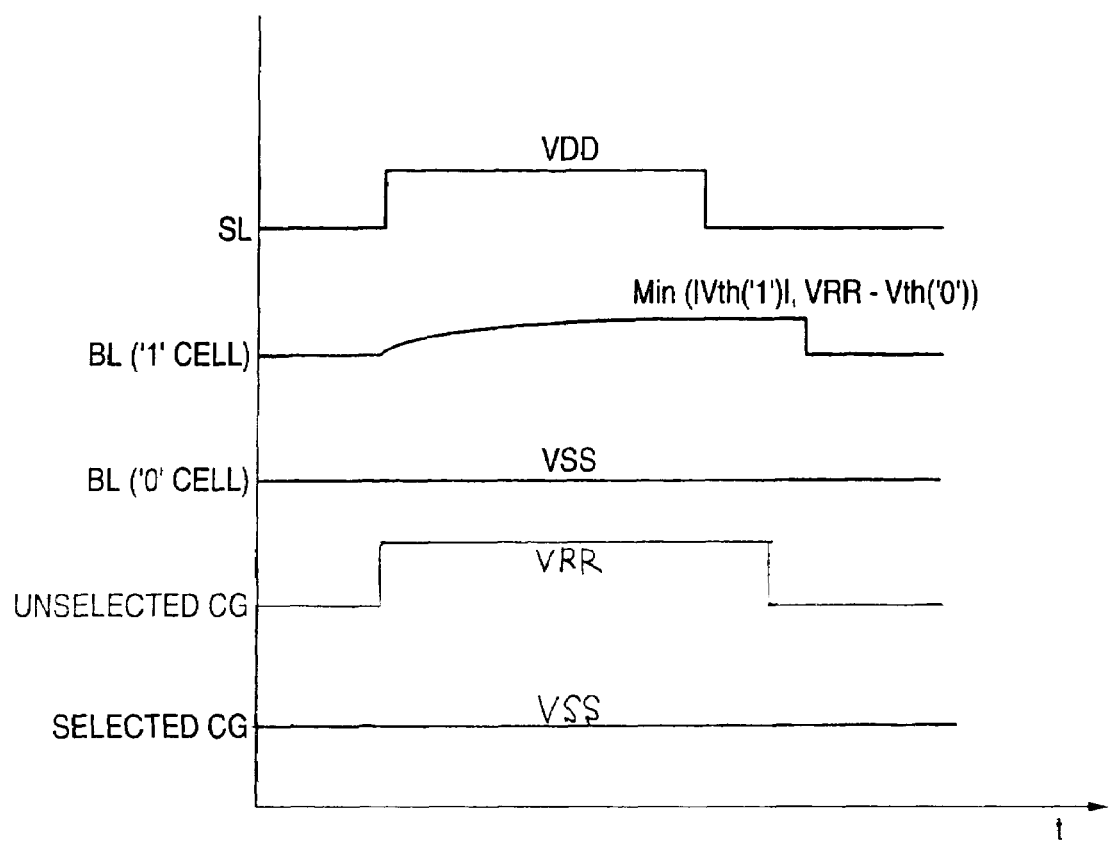
FIG. 18 is an exemplary drawing to show operation waveforms in read operation according to FIG. 15, of the nonvolatile semiconductor memory according to the first embodiment of the invention.

Operation waveforms in the read operation according to FIG. 15 are represented as shown in FIG. 18. FIG. 18 shows pulse voltage states applied to the source line SL, the bit line BL of '1' write cell, the bit line BL of '0' write cell, unselected word line CG, and selected word line CG.

The read operation is to charge the bit line BL from the source line SL and the potential of the bit line BL remains the ground potential VSS or goes high "H" in response to the threshold value of the selected memory cell transistor and thus the potential is determined with a sense amplifier S/A.

Write verification differs from the read operation only in potential relationship such that the potential of the selected word line CG is higher than 0 V, for example, and basically is similar to the read operation. Erase verification differs from the read operation only in potential relationship such that all potentials of the word lines CG of the memory string selected are 0 V, for example, and basically is similar to the read operation.

For write, to accomplish "1" write (holding an erased state) by self-boost, the portion below the channel of NAND cell transistor is once charged from the source line SL and then to write "0," the bit line BL is set to 0 V for discharge and the channel potential is set to 0 V; to write "1," the bit line BL is set to the power supply voltage VDD for holding a precharge state, the selected word line CG is set to VPP (write voltage), the voltage of a unselected word line CG in the selected NAND string is raised to bootstrap voltage VMM, and the channel potential is bootstrapped to a potential at which write does not occur. The potential of the bootstrap voltage VMM is set to such a potential at which "0" is not written into a unselected memory cell transistor in the selected NAND string and the channel potential of the memory cell transistor into which "1" is written rises sufficiently so as to hold the erased state if the channel potential is low. For the erase operation, the operation waveforms as in FIG. 16 are used because it is hard to supply potential to a back gate.

First, a high potential is applied to the source region of the memory cell transistor nearest to the source line SL from the source line SL through the SGS and erase operation is performed. Next, the potential of the word line CG of the memory cell transistor nearest to the source line SL is raised to VXX and the high potential is transferred to the source region. This means that the high potential is applied to the drain region of the next memory cell transistor and erase operation is executed. Next, the potential of the word line CG of the memory cell transistor is raised to VXX and the high potential is transferred to the source region. This means that the high potential is applied to the drain region of the next memory cell transistor and erase operation is executed. As the described operation is repeated, the memory cell transistors of the selected memory cell string are placed in erased state.

If the threshold voltage of the source line side selection gate transistor TGS is Vth, VXX is such a voltage at which high potential (VEE-Vth) can be transferred. VEE is a value at which a sufficient electric field can be applied at a low potential to the semiconductor substrate 10 by capacitive coupling between the control gate electrode and the charge trap level in the ONO insulating film.

(Another Example of Operation Voltage)

Another operation voltage example of the NAND cell unit using SONOS transistors as memory cell transistors, of the nonvolatile semiconductor memory according to the first embodiment of the invention is represented as shown in FIG. 19.

FIG. 19 shows the pulse voltage state for each of source line SL, bit line BL, select gate lines SGS and SGD, selected word line CG, unselected word line CG of the same layer, and unselected word line CG of a different layer in each of the operation modes of read mode, "0" write mode, "1" write mode, and erase mode for a selected block. Likewise, it also shows the pulse voltage state for each of source line SL, bit line BL, select gate lines SGS and SGD, and word line CG in each of the operation modes of read mode, "0" write mode, "1" write mode, and erase mode for an unselected block. In FIG. 19, VDD denotes power supply potential, VSS denotes ground potential, VRR denotes read voltage, VNN denotes unselected cell read voltage, VPP denotes write voltage, VEE denotes erase voltage, VMM denotes bootstrap voltage, and VXX denotes pulse voltage applied to selected word line CG as in FIG. 15. The voltage of VRR is set higher than the maximum threshold voltage of '0' data written cells and the voltage of VNN is lower than the minimum threshold voltage of '1' data written cells.

The read operation is determined by whether or not the voltage precharged in the bit line BL is discharged. For write verification, the potential of the selection gate transistor differs. Erase verification may be executed according to the read voltage and the read method shown in FIG. 15. For the write operation, the source line SL is set to the ground potential VSS. The potential of the source line SL is set to VSS at the read time and thus the source line SL is set to the ground potential VSS.

According to the NAND-type nonvolatile semiconductor memory according to the first embodiment of the invention, while the selection gate transistors are placed on the semiconductor substrate and the selectivity of a NAND type memory cell transistor by the selection gate transistor is maintained, the memory cell transistors of the stack gate structure or the SONOS structure can be stacked for providing a large memory capacity.

Second Embodiment

Device Structure

The configuration of a nonvolatile semiconductor memory according to a second embodiment of the invention is characterized in that a bit line 20 is placed in a layer below stacked memory cell transistors M10, M11, . . . , M42, and M43.

Figure 20:
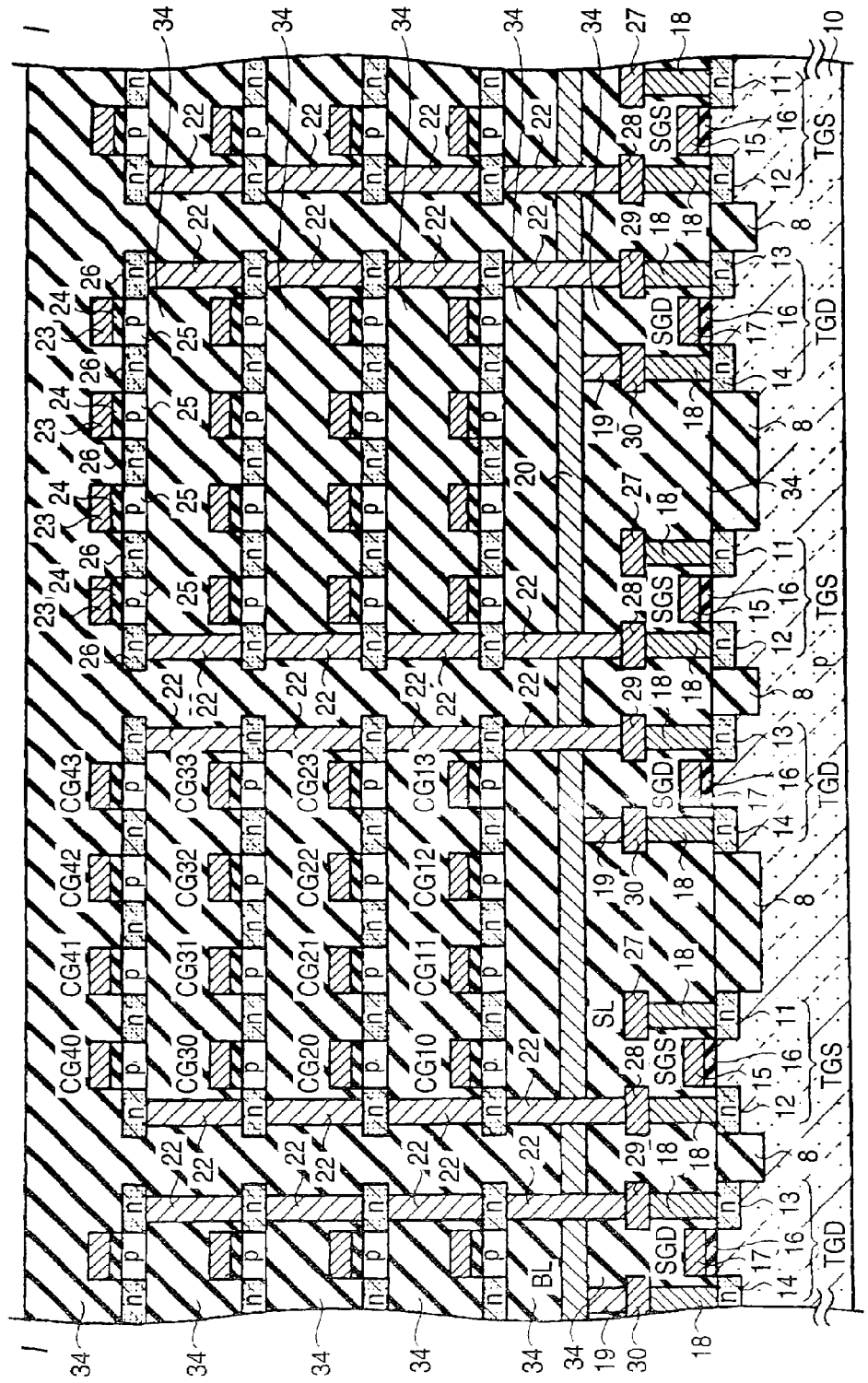
FIG. 20 is an exemplary drawing to show the schematic sectional structure of a NAND cell unit using a SONOS/TFT structure for memory cell transistors in a bit line extension direction taken on line I-I, of a nonvolatile semiconductor memory according to a second embodiment of the invention.

In the nonvolatile semiconductor memory according to the second embodiment of the invention, both a source line side selection gate transistor TGS and a bit line side selection gate transistor TGD can fold in the lower part of a stacked NAND cell unit 150 as shown in FIG. 20 and thus the planar size is further reduced as much as the placement space of the bit line side selection gate transistor TGD as compared with the first embodiment and the substantial cell size can be reduced.

Each memory cell transistor applied to the nonvolatile semiconductor memory according to the second embodiment of the invention is placed in an interlayer insulating film 34 stacked on a semiconductor substrate 10 and includes a SONOS/TFT structure made up of source/drain regions 26, a channel region 25 between the source/drain regions 26, an ONO insulating film 24 placed on the channel region 25, and a control gate electrode 23 placed on the ONO insulating film 24, as shown in FIG. 20.

The schematic sectional structure of each NAND cell unit using SONOS transistors as memory cell transistors, of the nonvolatile semiconductor memory according to the second embodiment of the invention includes a semiconductor substrate 10, field isolation regions (STI) 8 placed in the semiconductor substrate 10, source/drain regions 13 an 14 of a bit line side selection gate transistor TGD placed in the semiconductor substrate 10 sandwiched between the field isolation regions 8, source/drain regions 11 and 12 of a source line side selection gate transistor TGS placed in the semiconductor substrate 10 sandwiched between the field isolation regions (STI) 8, a gate insulating film 16 placed on the semiconductor substrate 10 between the source/drain regions 13 and 14, a select gate line (SGD) 17 placed on the gate insulating film 16, a gate insulating film 16 placed on the semiconductor substrate 10 between the source/drain regions 11 and 12, a select gate line (SGS) 15 placed on the gate insulating film 16, contact plugs 18 placed on the source/drain regions 11, 12, 13, and 14, metal wiring layers 27, 28, 29, and 30 connected through the source/drain regions 11, 12, 13, and 14 and the contact plugs 18, a bit line 20 stacked on the metal wiring layers 27, 28, 29, and 30 through an interlayer insulting film 34 and connected through a contact plug 19 to the metal wiring layer 30 connected to the drain region 14 of the bit line side selection gate transistor TGD, a first memory cell string made up of memory cell transistors M10, M11, M12, and M13 of an SONOS structure stacked on the bit line 20 through an interlayer insulting film 34 and connected in series through source/drain regions 26 and contact plugs 22 between the metal wiring layers 28 and 29, a second memory cell string made up of memory cell transistors M20, M21, M22, and M23 of an SONOS structure stacked on the memory cell transistors M10, M11, M12, and M13 through an interlayer insulting film 34, connected in parallel with the second memory cell string, and connected in series through source/drain regions 26, channel regions 25, and contact plugs 22, a third memory cell string made up of memory cell transistors M30, M31, M32, and M33 of an SONOS structure stacked on the memory cell transistors M20, M21, M22, and M23 through an interlayer insulting film 34, connected in parallel with the first and second memory cell strings, and connected in series through source/drain regions 26, channel regions 25, and contact plugs 22, a fourth memory cell string made up of memory cell transistors M40, M41, M42, and M43 of an SONOS structure stacked on the memory cell transistors M30, M31, M32, and M33 through an interlayer insulting film 34, connected in parallel with the first to third memory cell strings, and connected in series through source/drain regions 26 and contact plugs 22, and a source line SL connected to the metal wiring layer 27, as shown in FIG. 20.

(Planar Pattern Configuration)

Figure 21:
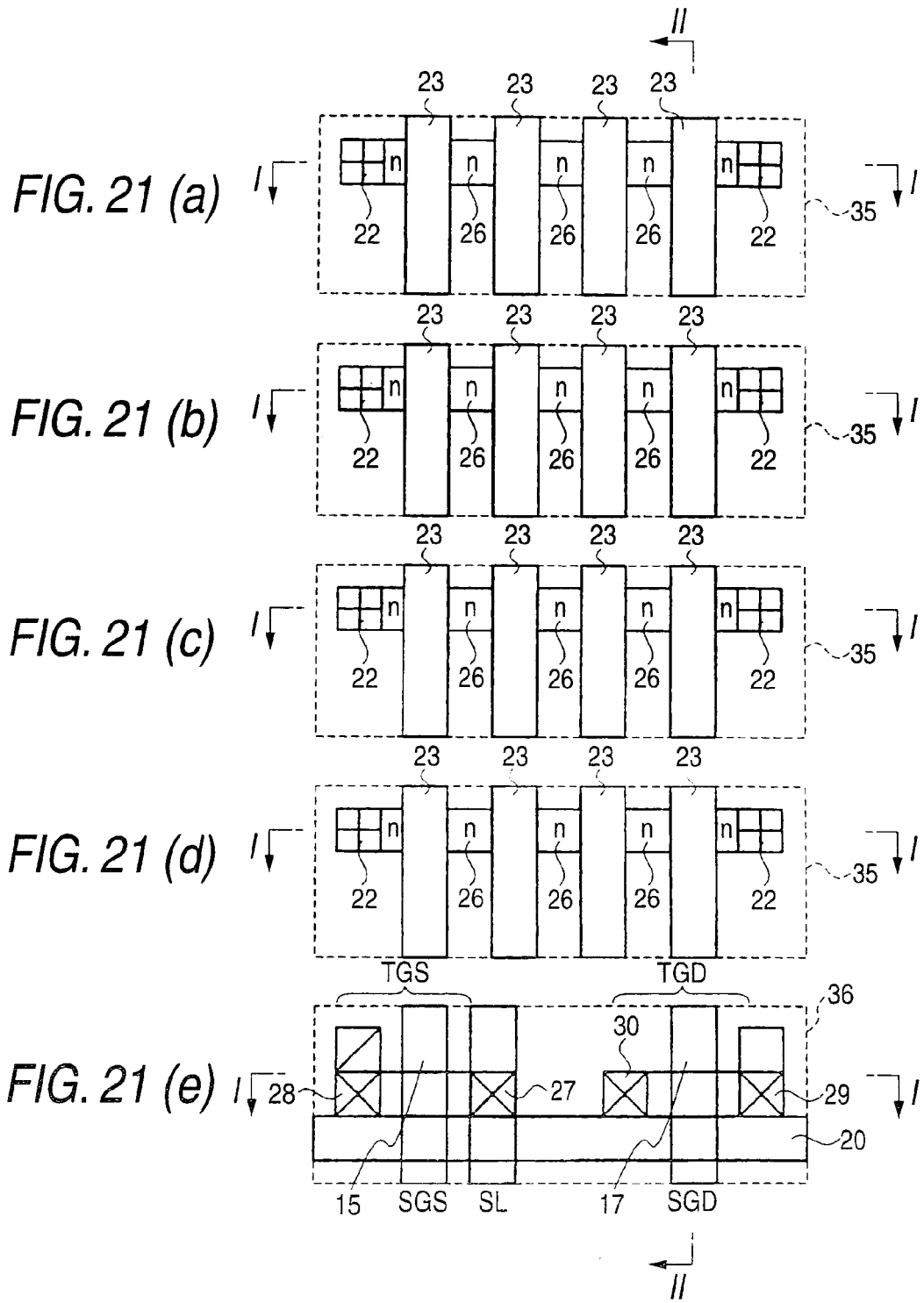
FIG. 21 shows the schematic planar pattern configuration of the nonvolatile semiconductor memory according to the second embodiment of the invention.

The schematic planar pattern configuration of the NAND cell unit 150 using SONOS transistors as memory cell transistors, of the nonvolatile semiconductor memory according to the second embodiment of the invention includes a NAND cell part plain 35 of a fourth layer as shown in FIG. 21(a), a NAND cell part plain 35 of a third layer as shown in FIG. 21(b), a NAND cell part plain 35 of a second layer as shown in FIG. 21(c), a NAND cell part plain 35 of a first layer as shown in FIG. 21(d), and a select gate part plain 36 as shown in FIG. 21(e).

In the NAND cell part plain 35 of the fourth layer, a pattern of the source/drain regions 26 and the control gate electrodes 23 of the SONOS transistors is placed continuously and the NAND cell part plain 35 is connected at one end to the NAND cell part plain 35 of the third layer through the contact plug 22, as shown in FIG. 21(a).

In the NAND cell part plain 35 of the third layer, a pattern of the source/drain regions 26 and the control gate electrodes 23 of the SONOS transistors is placed continuously and the NAND cell part plain 35 is connected at one end to the NAND cell part plain 35 of the second layer through the contact plug 22, as shown in FIG. 21(b).

In the NAND cell part plain 35 of the second layer, a pattern of the source/drain regions 26 and the control gate electrodes 23 of the SONOS transistors is placed continuously and the NAND cell part plain 35 is connected at one end to the NAND cell part plain 35 of the first layer through the contact plug 22, as shown in FIG. 21(c).

In the NAND cell part plain 35 of the first layer, a pattern of the source/drain regions 26 and the control gate electrodes 23 of the SONOS transistors is placed continuously and the NAND cell part plain 35 is connected at one end to the select gate part plain 36 through the contact plug 22, as shown in FIG. 21(d).

In the select gate part plain 36, a pattern of the source line SL made up of the metal wiring layer 28 connected to the drain region 12 of the source line side selection gate transistor TGS, the select gate line (SGS) 15, and the metal wiring layer 27 connected to the source region 11 of the source line side selection gate transistor TGS and a pattern of the metal wiring layer 30 connected to the drain region 14 of the bit line side selection gate transistor TGD, the select gate line (SGD) 17, and the metal wiring layer 29 connected to the source region 13 of the bit line side selection gate transistor TGD are placed, as shown in FIG. 21(e). The metal wiring layer 30 connected to the drain region 14 of the bit line side selection gate transistor TGD is connected to the bit line 20 through the contact plug 19.

According to the nonvolatile semiconductor memory according to the second embodiment of the invention, the bit line 20 is placed in the layer below the stacked memory cell transistors and both the source line side selection gate transistor TGS and the bit line side selection gate transistor TGD can fold in the lower part of the stacked NAND cell unit 150, so that the substantial cell size can be reduced.

In the description given above, the nonvolatile semiconductor memory has TFTs of the SONOS structure as the memory cell transistors by way of example, but if the nonvolatile semiconductor memory has TFTs of a stack gate stacked structure, the transistors can also be formed as a stack in a similar manner.

According to the NAND-type nonvolatile semiconductor memory according to the second embodiment of the invention, while the selection gate transistors are placed on the semiconductor substrate and the selectivity of a NAND type memory cell transistor by the selection gate transistor is maintained, the memory cell transistors of the stack gate/TFT structure or the SONOS/TFT structure can be stacked for providing a large memory capacity.

Third Embodiment

Device Structure

Figure 22:
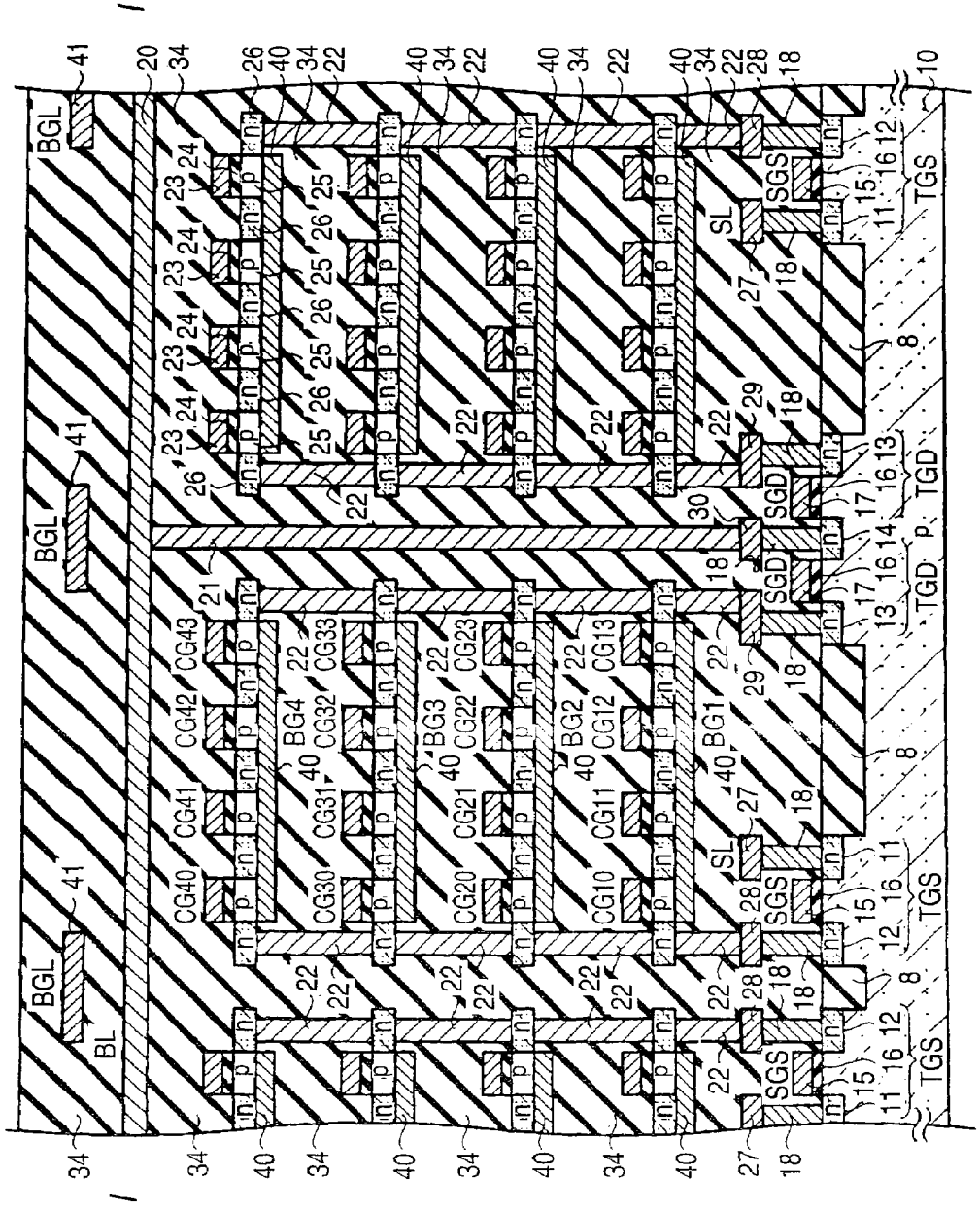
FIG. 22 is an exemplary drawing to show the schematic sectional structure of a NAND cell unit using a SONOS/TFT structure including a back gate electrode for memory cell transistors in a bit line extension direction taken on line I-I, of a nonvolatile semiconductor memory according to a third embodiment of the invention.

Each memory cell transistor applied to a nonvolatile semiconductor memory according to a third embodiment of the invention is placed in an interlayer insulating film 34 stacked on a semiconductor substrate 10 and includes a SONOS/TFT structure made up of a back gate electrode 40, source/drain regions 26 placed on the back gate electrode 40, a channel region 25 placed on the back gate electrode 40 and between the source/drain regions 26, an ONO insulating film 24 placed on the channel region 25, and a control gate electrode 23 placed on the ONO insulating film 24, as shown in FIG. 22.

The schematic sectional structure of each NAND cell unit using SONOS transistors as memory cell transistors each placed on a back gate electrode 40, of the nonvolatile semiconductor memory according to the third embodiment of the invention includes a semiconductor substrate 10, field isolation regions (STI) 8 placed in the semiconductor substrate 10, source/drain regions 13 an 14 of a bit line side selection gate transistor TGD placed in the semiconductor substrate 10 sandwiched between the field isolation regions 8, source/drain regions 11 and 12 of a source line side selection gate transistor TGS placed in the semiconductor substrate 10 sandwiched between the field isolation regions (STI) 8, a gate insulating film 16 placed on the semiconductor substrate 10 between the source/drain regions 13 and 14, a select gate line (SGD) 17 placed on the gate insulating film 16, a gate insulating film 16 placed on the semiconductor substrate 10 between the source/drain regions 11 and 12, a select gate line (SGS) 15 placed on the gate insulating film 16, contact plugs 18 placed on the source/drain regions 11, 12, 13, and 14, metal wiring layers 27, 28, 29, and 30 connected through the source/drain regions 11, 12, 13, and 14 and the contact plugs 18, a first memory cell string made up of memory cell transistors M10, M11, M12, and M13 of an SONOS structure stacked on the metal wiring layers 27, 28, 29, and 30 through an interlayer insulting film 34, connected in series through source/drain regions 26 and contact plugs 22 between the metal wiring layers 28 and 29, and placed on the back gate electrode 40, a second memory cell string made up of memory cell transistors M20, M21, M22, and M23 of an SONOS structure stacked on the memory cell transistors M10, M11, M12, and M13 through an interlayer insulting film 34, connected in parallel with the first memory cell string, connected in series through source/drain regions 26, channel regions 25, and contact plugs 22, and placed on the back gate electrode 40, a third memory cell string made up of memory cell transistors M30, M31, M32, and M33 of an SONOS structure stacked on the memory cell transistors M20, M21, M22, and M23 through an interlayer insulting film 34, connected in parallel with the first and second memory cell strings, connected in series through source/drain regions 26, channel regions 25, and contact plugs 22, and placed on the back gate electrode 40, a fourth memory cell string made up of memory cell transistors M40, M41, M42, and M43 of an SONOS structure stacked on the memory cell transistors M30, M31, M32, and M33 through an interlayer insulting film 34, connected in parallel with the first to third memory cell strings, connected in series through source/drain regions 26, channel regions 25, and contact plugs 22, and placed on the back gate electrode 40, a source line SL connected to the metal wiring layer 27, a bit line 20 connected to the metal wiring layer 30 through a contact plug 21, and a back gate line 41 connected to the back gate electrode 40, as shown in FIG. 22. The back gate line (BGL) 41 extends in a direction orthogonal to the bit line BL, namely, a row direction in which the word line extends.

The schematic planar pattern configuration of the NAND cell unit 150 using SONOS transistors each placed on the back gate electrode 40 as memory cell transistors, of the nonvolatile semiconductor memory according to the third embodiment of the invention is similar to that shown in FIG. 14.

(Operation Voltage Example)

An operation voltage example of the NAND cell unit using SONOS transistors to which the back gate electrode 40 is connected as memory cell transistors, of the nonvolatile semiconductor memory according to the third embodiment of the invention is represented as shown in FIG. 23.

FIG. 23 shows the pulse voltage state for each of back gate electrode BG, bit line BL, select gate lines SGS and SGD, selected word line CG, unselected word line CG of the same layer, and unselected word line CG of a different layer in each of the operation modes of read mode, "0" write mode, "1" write mode, and erase mode for a selected block. Likewise, it also shows the pulse voltage state for each of back gate electrode BG, bit line BL, select gate lines SGS and SGD, and word line CG in each of the operation modes of read mode, "0" write mode, "1" write mode, and erase mode for an unselected block. In FIG. 23, VDD denotes power supply potential, VSS denotes ground potential, VRR denotes read voltage, VNN denotes unselected cell read voltage, VPP denotes write voltage, VEE denotes erase voltage, and VMM denotes bootstrap voltage. The voltage of VRR is set higher than the maximum threshold voltage of '0' data written cells and the voltage of VNN is lower than the minimum threshold voltage of '1' data written cells.

In the erase operation, the memory cell transistors in the selected block are placed in erased state in batch. As with FIG. 19, the read operation is determined by whether or not the voltage precharged in the bit line BL is discharged. For write verification, the potential of the selection gate transistor differs. Erase verification may be executed according to the read voltage and the read method shown in FIG. 15. For the write operation, the back gate electrode BG is set to the ground potential VSS. The potential of the back gate electrode BG is set to VSS at the read operation and thus the back gate electrode BG is set to the ground potential VSS.

In the description given above, the nonvolatile semiconductor memory has TFTs of the SONOS structure as the memory cell transistors by way of example, but if the nonvolatile semiconductor memory has TFTs of a stack gate stacked structure, the transistors can also be formed as a stack in a similar manner.

According to the NAND-type nonvolatile semiconductor memory according to the third embodiment of the invention, while the selection gate transistors are placed on the semiconductor substrate and the selectivity of a NAND type memory cell transistor by the selection gate transistor is maintained, the memory cell transistors of the stack gate/TFT structure or the SONOS/TFT structure having a back gate electrode can be stacked for providing a large memory capacity.

According to the NAND-type nonvolatile semiconductor memory according to the third embodiment of the invention, the back gate electrode makes it possible to place the memory cell transistors in the selected block in erased state in batch in the erase operation.

Fourth Embodiment

Device Structure

Figure 24:
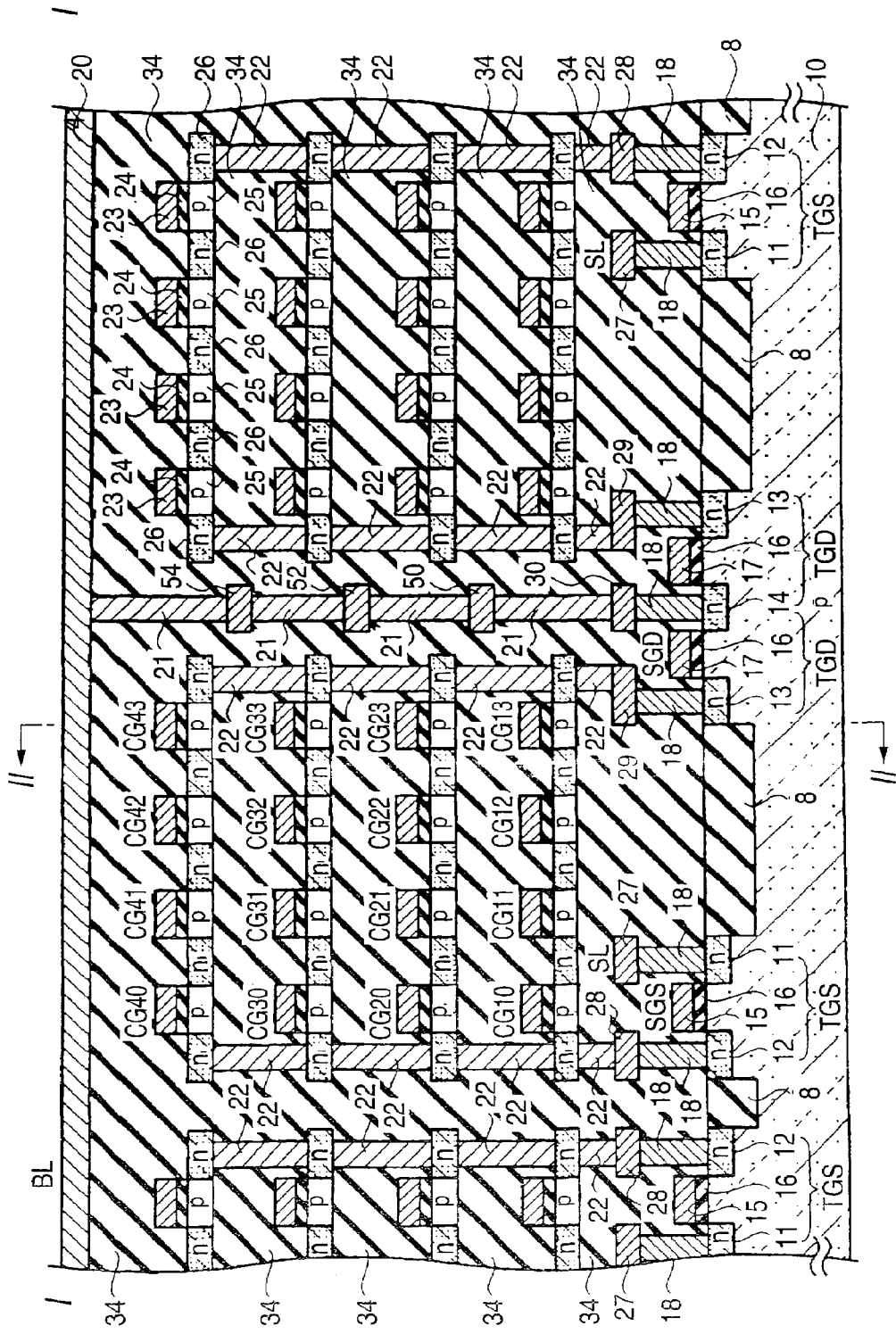
FIG. 24 is an exemplary drawing to show the schematic sectional structure of a NAND cell unit using a SONOS/TFT structure for memory cell transistors in a bit line extension direction taken on line I-I, of a nonvolatile semiconductor memory according to a fourth embodiment of the invention.

Each memory cell transistor applied to a nonvolatile semiconductor memory according to a fourth embodiment of the invention is placed in an interlayer insulating film 34 stacked on a semiconductor substrate 10 and includes a SONOS/TFT structure made up of source/drain regions 26, a channel region 25 between the source/drain regions 26, an ONO insulating film 24 placed on the channel region 25, and a control gate electrode 23 placed on the ONO insulating film 24, as shown in FIG. 24.

The schematic sectional structure of each NAND cell unit using SONOS transistors as memory cell transistors, of the nonvolatile semiconductor memory according to the first embodiment of the invention includes a semiconductor substrate 10, field isolation regions (STI) 8 placed in the semiconductor substrate 10, source/drain regions 13 an 14 of a bit line side selection gate transistor TGD placed in the semiconductor substrate 10 sandwiched between the field isolation regions 8, source/drain regions 11 and 12 of a source line side selection gate transistor TGS placed in the semiconductor substrate 10 sandwiched between the field isolation regions (STI) 8, a gate insulating film 16 placed on the semiconductor substrate 10 between the source/drain regions 13 and 14, a select gate line (SGD) 17 placed on the gate insulating film 16, a gate insulating film 16 placed on the semiconductor substrate 10 between the source/drain regions 11 and 12, a select gate line (SGS) 15 placed on the gate insulating film 16, contact plugs 18 placed on the source/drain regions 11, 12, 13, and 14, metal wiring layers 27, 28, 29, and 30 connected through the source/drain regions 11, 12, 13, and 14 and the contact plugs 18, a first memory cell string made up of memory cell transistors M10, M11, M12, and M13 of an SONOS structure stacked on the metal wiring layers 27, 28, 29, and 30 through an interlayer insulting film 34 and connected in series through source/drain regions 26 and contact plugs 22 between the metal wiring layers 28 and 29, a second memory cell string made up of memory cell transistors M20, M21, M22, and M23 of an SONOS structure stacked on the memory cell transistors M10, M11, M12, and M13 through an interlayer insulting film 34, connected in parallel with the first memory cell string, and connected in series through source/drain regions 26, channel regions 25, and contact plugs 22, a third memory cell string made up of memory cell transistors M30, M31, M32, and M33 of an SONOS structure stacked on the memory cell transistors M20, M21, M22, and M23 through an interlayer insulting film 34, connected in parallel with the first and second memory cell strings, and connected in series through source/drain regions 26, channel regions 25, and contact plugs 22, a fourth memory cell string made up of memory cell transistors M40, M41, M42, and M43 of an SONOS structure stacked on the memory cell transistors M30, M31, M32, and M33 through an interlayer insulting film 34, connected in parallel with the first to third memory cell strings, and connected in series through source/drain regions 26 and contact plugs 22, a source line SL connected to the metal wiring layer 27, a metal wiring layer 50 connected to the metal wiring layer 30 through a contact plug 21, a metal wiring layer 52 connected to the metal wiring layer 50 through a contact plug 21, a metal wiring layer 54 connected to the metal wiring layer 52 through a contact plug 21, and a bit line 20 connected to the metal wiring layer 54 through a contact plug 21, as shown in FIG. 24.

The schematic planar pattern configuration of the NAND cell unit 150 using SONOS transistors as memory cell transistors, of the nonvolatile semiconductor memory according to the fourth embodiment of the invention is similar to that shown in FIG. 14.

Figure 25:
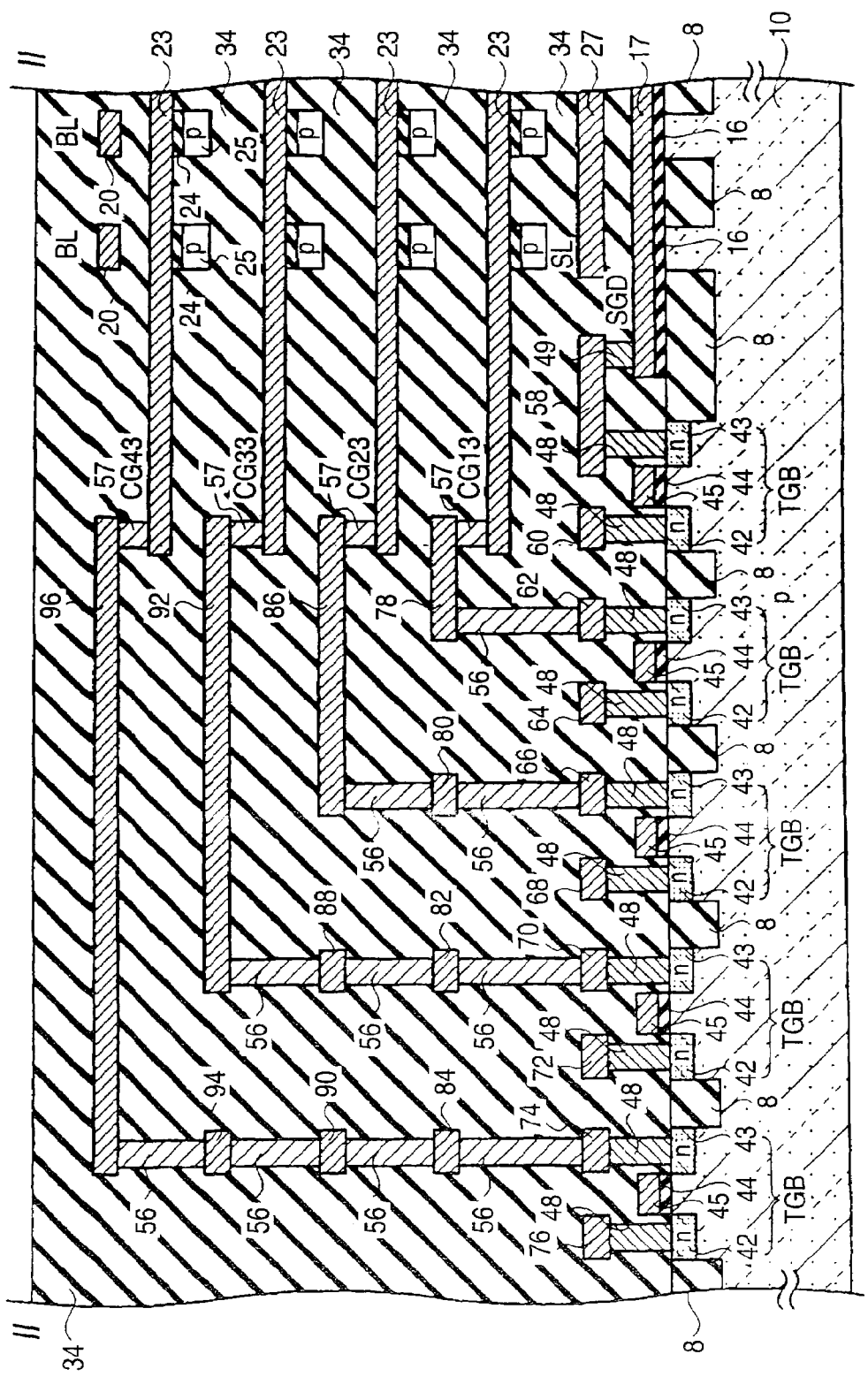
FIG. 25 is an exemplary drawing to show the schematic sectional structure of the NAND cell unit using a SONOS/TFT structure for memory cell transistors in a word line extension direction taken on line II-II, of the nonvolatile semiconductor memory according to the fourth embodiment of the invention.

The sectional structure of the NAND cell unit using SONOS transistors as memory cell transistors in a word line extension direction taken on line II-II, of the nonvolatile semiconductor memory according to the fourth embodiment of the invention is represented schematically as shown in FIG. 25. FIG. 25 corresponds to the schematic sectional structure along word lines CG13, CG23, CG33, and CG43 extending in the row direction. For example, it can be seen as the schematic sectional structure taken on line II-II in FIG. 21 or it can also be seen as the schematic sectional structure taken on line II-II when the bit line side selection gate transistor TGD is placed below the memory cell transistor M13 in FIG. 24.

The sectional structure of the nonvolatile semiconductor memory according to the fourth embodiment of the invention in the word line extension direction taken on line II-II includes a semiconductor substrate 10, field isolation regions (STI) 8 placed in the semiconductor substrate 10, source/drain regions 42 an 43 of block selection transistors TBG each placed in the semiconductor substrate 10 sandwiched between the field isolation regions 8, gate insulating films 44 each placed on the semiconductor substrate 10 between the source/drain regions 42 and 43, select gate lines (SWG) 45 each placed on the gate insulating film 44, a gate insulating film 16 sandwiched between source/drain regions of a bit line side selection gate transistor TGD and placed on the semiconductor substrate 10 between the field isolation regions 8, a select gate line (SGD) 17 placed on the gate insulating film 16, contact plugs 48 placed on the source/drain regions 42 and 43, a contact plug 49 placed on the select gate line (SGD) 17, metal wiring layers 60, 64, 68, 72, and 76 each connected through a contact plug 48 to the source region 42 of the block selection transistor TGB, a metal wiring layer 58 connected through a contact plug 48 to the drain region 43 of the block selection transistor TGB and connected through a contact plug 49 to the select gate line (SGD) 17 of the bit line side selection gate transistor TGD, metal wiring layers 62, 66, 70, and 74 each connected through a contact plug 48 to the drain region 43 of the block selection transistor TGB, a metal wiring layer 27 placed on the top of the select gate line (SGD) 17 through an interlayer insulating film 34, a word line CG13 placed on the metal wiring layers 27, 58, and 60 through an interlayer insulating film 34, a contact plug 57 placed on the word line CG13, contact plugs 56 placed on the metal wiring layers 62, 66, 70, and 74, a metal wiring layer 78 connected to the metal wiring layer 62 through the contact plug 56 and connected to the word line CG13 through the contact plug 57, metal wiring layers 80, 82, and 84 connected to the metal wiring layers 66, 70, and 74 respectively through the contact plug 56, a word line CG23 placed on the word line CG13 through an interlayer insulating film 34, a contact plug 57 placed on the word line CG23, contact plugs 56 placed on the metal wiring layers 80, 82, and 84, a metal wiring layer 86 connected to the metal wiring layer 80 through the contact plug 56 and connected to the word line CG23 through the contact plug 57, metal wiring layers 88 and 90 connected to the metal wiring layers 82 and 84 respectively through the contact plug 56, a word line CG33 placed on the word line CG23 through an interlayer insulating film 34, a contact plug 57 placed on the word line CG33, contact plugs 56 placed on the metal wiring layers 88 and 90, a metal wiring layer 92 connected to the metal wiring layer 88 through the contact plug 56 and connected to the word line CG33 through the contact plug 57, a metal wiring layer 94 connected to the metal wiring layer 90 through the contact plug 56, a word line CG43 placed on the word line CG33 through an interlayer insulating film 34, a contact plug 57 placed on the word line CG43, a contact plug 56 placed on the metal wiring layer 94, a metal wiring layer 96 connected to the metal wiring layer 94 through the contact plug 56 and connected to the word line CG43 through the contact plug 57, a bit line 20 placed on the word line CG43 through an interlayer insulating film 34, and a source line SL connected to the metal wiring layer 27, as shown in FIG. 25.

According to the NAND-type nonvolatile semiconductor memory according to the fourth embodiment of the invention, the number of the wiring layers of the metal wiring layers is nine as shown in FIGS. 24 and 25.

In the description given above, the nonvolatile semiconductor memory has TFTs of the SONOS structure as the memory cell transistors by way of example, but if the nonvolatile semiconductor memory has TFTs of a stack gate stacked structure, the transistors can also be formed as a stack in a similar manner.

According to the NAND-type nonvolatile semiconductor memory according to the fourth embodiment of the invention, while the selection gate transistors are placed on the semiconductor substrate and the selectivity of a NAND type memory cell transistor by the selection gate transistor is maintained, the memory cell transistors of the stack gate/TFT structure or the SONOS/TFT structure can be stacked for providing a large memory capacity.

Fifth Embodiment

Figure 26:
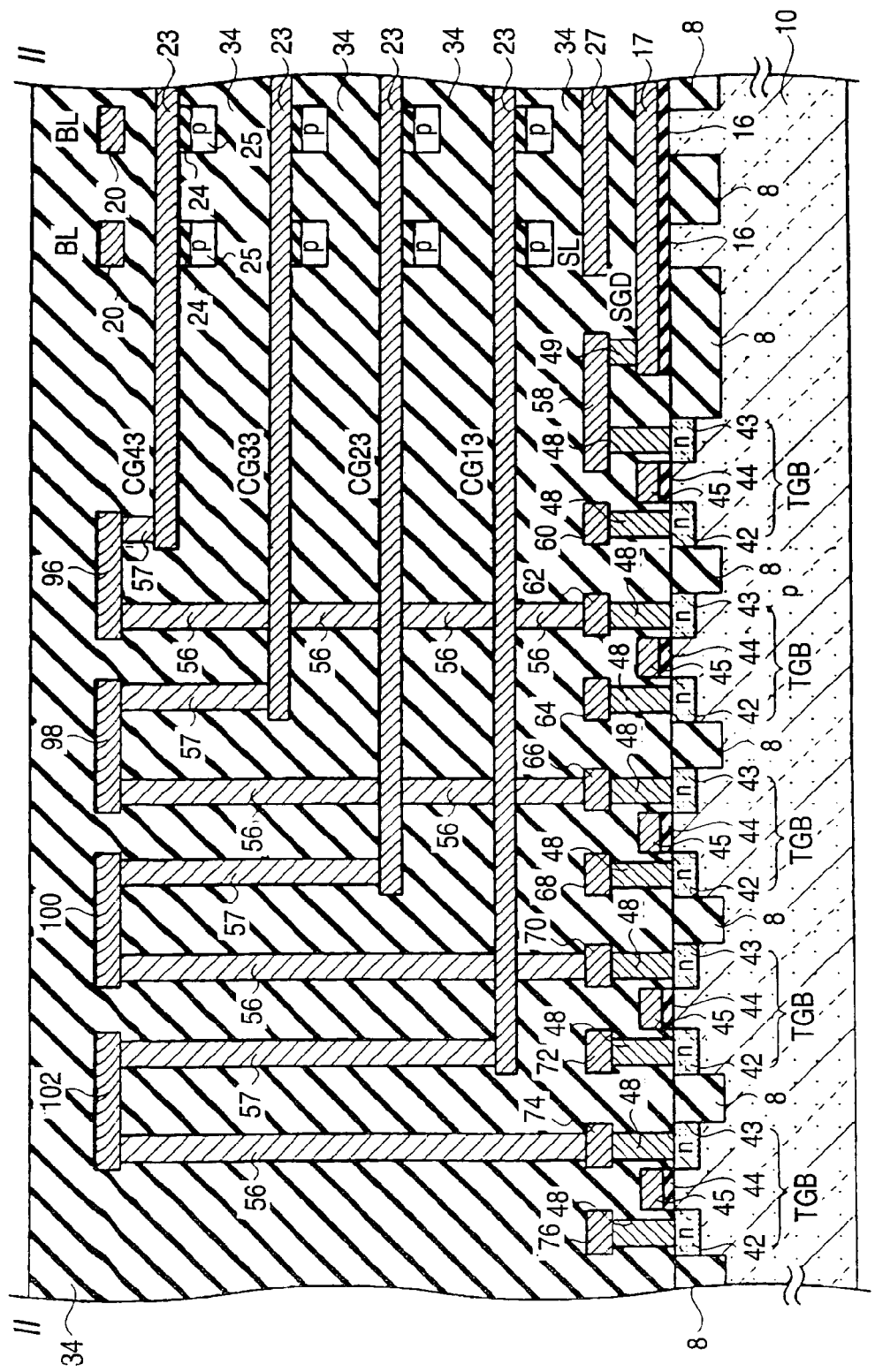
FIG. 26 is an exemplary drawing to show the schematic sectional structure of a NAND cell unit using a SONOS/TFT structure for memory cell transistors based on alternate drawing in a word line extension direction taken on line II-II, of a nonvolatile semiconductor memory according to a fifth embodiment of the invention.

The sectional structure of a NAND cell unit using SONOS transistors as memory cell transistors in a word line extension direction taken on line II-II, of a nonvolatile semiconductor memory according to a fifth embodiment of the invention is represented schematically as shown in FIG. 26. FIG. 26 corresponds to the schematic sectional structure along word lines CG13, CG23, CG33, and CG43 extending in the row direction. For example, it can be seen as the schematic sectional structure taken on line II-II in FIG. 21 or it can also be seen as the schematic sectional structure taken on line II-II when the bit line side selection gate transistor TGD is placed below the memory cell transistor M13 in FIG. 24.

The sectional structure of the nonvolatile semiconductor memory according to the fifth embodiment of the invention in the word line extension direction taken on line II-II includes a semiconductor substrate 10, field isolation regions (STI) 8 placed in the semiconductor substrate 10, source/drain regions 42 an 43 of block selection transistors TBG each placed in the semiconductor substrate 10 sandwiched between the field isolation regions 8, gate insulating films 44 each placed on the semiconductor substrate 10 between the source/drain regions 42 and 43, select gate lines (SWG) 45 each placed on the gate insulating film 44, a gate insulating film 16 sandwiched between source/drain regions of a bit line side selection gate transistor TGD and placed on the semiconductor substrate 10 between the field isolation regions 8, a select gate line (SGD) 17 placed on the gate insulating film 16, contact plugs 48 placed on the source/drain regions 42 and 43, a contact plug 49 placed on the select gate line (SGD) 17, metal wiring layers 60, 64, 68, 72, and 76 each connected through a contact plug 48 to the source region 42 of the block selection transistor TGB, a metal wiring layer 58 connected through a contact plug 48 to the drain region 43 of the block selection transistor TGB and connected through a contact plug 49 to the select gate line (SGD) 17 of the bit line side selection gate transistor TGD, metal wiring layers 62, 66, 70, and 74 each connected through a contact plug 48 to the drain region 43 of the block selection transistor TGB, a metal wiring layer 27 placed on the top of the select gate line (SGD) 17 through an interlayer insulating film 34, a word line CG13 placed on the metal wiring layers 27 and 58 to 72 through an interlayer insulating film 34, a contact plug 57 placed on the word line CG13, contact plugs 56 placed on the metal wiring layers 62, 66, 70, and 74, a metal wiring layer 102 connected to the metal wiring layer 74 through the contact plug 56 and connected to the word line CG13 through the contact plug 57, a word line CG23 placed on the word line CG13 through an interlayer insulating film 34, a contact plug 57 placed on the word line CG23, a metal wiring layer 100 connected to the metal wiring layer 70 through the contact plug 56 and connected to the word line CG23 through the contact plug 57, a word line CG33 placed on the word line CG23 through an interlayer insulating film 34, a contact plug 57 placed on the word line CG33, a metal wiring layer 98 connected to the metal wiring layer 66 through the contact plug 56 and connected to the word line CG33 through the contact plug 57, a word line CG43 placed on the word line CG33 through an interlayer insulating film 34, a contact plug 57 placed on the word line CG43, a metal wiring layer 96 connected to the metal wiring layer 62 through the contact plug 56 and connected to the word line CG43 through the contact plug 57, a bit line 20 placed on the word line CG43 through an interlayer insulating film 34, and a source line SL connected to the metal wiring layer 27, as shown in FIG. 26.

According to the NAND-type nonvolatile semiconductor memory according to the fifth embodiment of the invention, the number of the wiring layers of the metal wiring layers is six as shown in FIG. 26.

(Planar Pattern Configuration)

Figure 27:
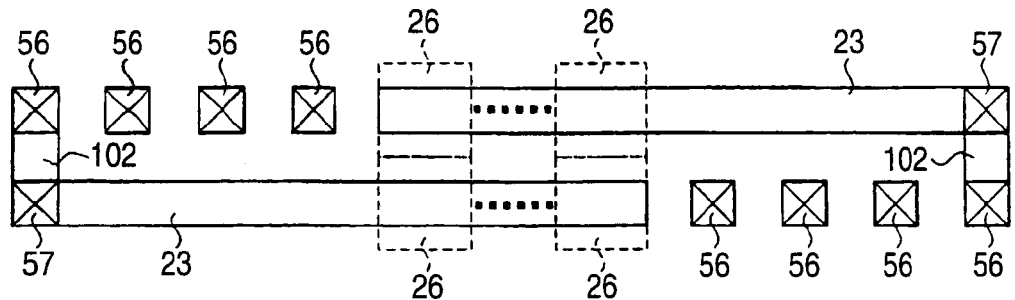
FIG. 27 is an exemplary drawing to show the schematic planar pattern configuration of the nonvolatile semiconductor memory according to the fifth embodiment of the invention based on alternate drawing in the word line extension direction.
Figure 27:
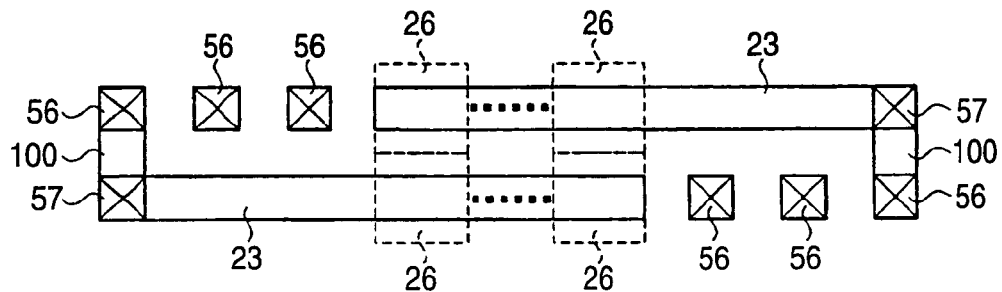
Figure 27:
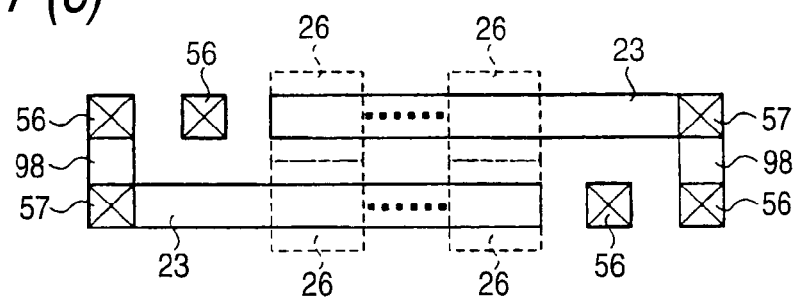
Figure 27:
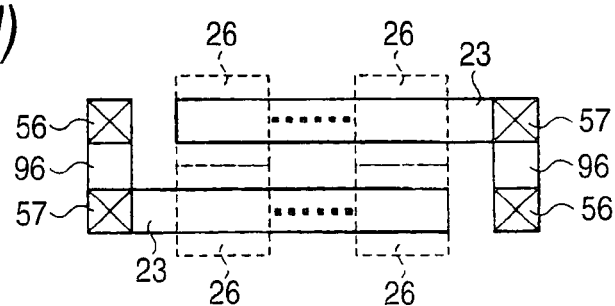

The schematic planar pattern configuration of the NAND cell unit using SONOS transistors as memory cell transistors based on alternate drawing in the word line extension direction, of the nonvolatile semiconductor memory according to the fifth embodiment of the invention is represented as shown in FIG. 27. That is, FIG. 27(a) shows an alternate drawing planar pattern of the word line CG13 of a first layer. FIG. 27(b) shows an alternate drawing planar pattern of the word line CG23 of a second layer. FIG. 27(c) shows an alternate drawing planar pattern of the word line CG33 of a third layer. FIG. 27(d) shows an alternate drawing planar pattern of the word line CG43 of a fourth layer.

In the planar pattern end part shown in FIG. 27(a), a contact plug 57 placed on the word line CG13 and a contact plug 56 placed on a metal wiring layer 74 connected through a contact plug 48 to a drain region 43 of a block selection transistor TGB are connected through a metal wiring layer 102.

In the planar pattern end part shown in FIG. 27(b), a contact plug 57 placed on the word line CG23 and a contact plug 56 placed on a metal wiring layer 70 connected through a contact plug 48 to a drain region 43 of a block selection transistor TGB are connected through a metal wiring layer 100.

In the planar pattern end part shown in FIG. 27(c), a contact plug 57 placed on the word line CG33 and a contact plug 56 placed on a metal wiring layer 66 connected through a contact plug 48 to a drain region 43 of a block selection transistor TGB are connected through a metal wiring layer 98.

In the planar pattern end part shown in FIG. 27(d), a contact plug 57 placed on the word line CG43 and a contact plug 56 placed on a metal wiring layer 62 connected through a contact plug 48 to a drain region 43 of a block selection transistor TGB are connected through a metal wiring layer 96.

The NAND-type nonvolatile semiconductor memory according to the fifth embodiment of the invention has the planar pattern based on alternate drawing in the word line CG extension direction, whereby the occupation area of the planar pattern of the peripheral wiring section from the NAND cell unit 150 to the block selection transistor TGB can be reduced.

According to the NAND-type nonvolatile semiconductor memory according to the fifth embodiment of the invention, the metal wiring layers 96, 98, 100, and 102 are formed at the same metal layer level in the planar pattern of the peripheral wiring section from the NAND cell unit 150 to the block selection transistor TGB, whereby the number of the metal wiring layers can be decreased and the number of manufacturing steps can be reduced.

In the description given above, the nonvolatile semiconductor memory has TFTs of the SONOS structure as the memory cell transistors by way of example, but if the nonvolatile semiconductor memory has TFTs of a stack gate stacked structure, the transistors can also be formed as a stack in a similar manner.

According to the NAND-type nonvolatile semiconductor memory according to the fifth embodiment of the invention, while the selection gate transistors are placed on the semiconductor substrate and the selectivity of a NAND type memory cell transistor by the selection gate transistor is maintained, the memory cell transistors of the stack gate/TFT structure or the SONOS/TFT structure can be stacked for providing a large memory capacity.

Sixth Embodiment

Figure 28:
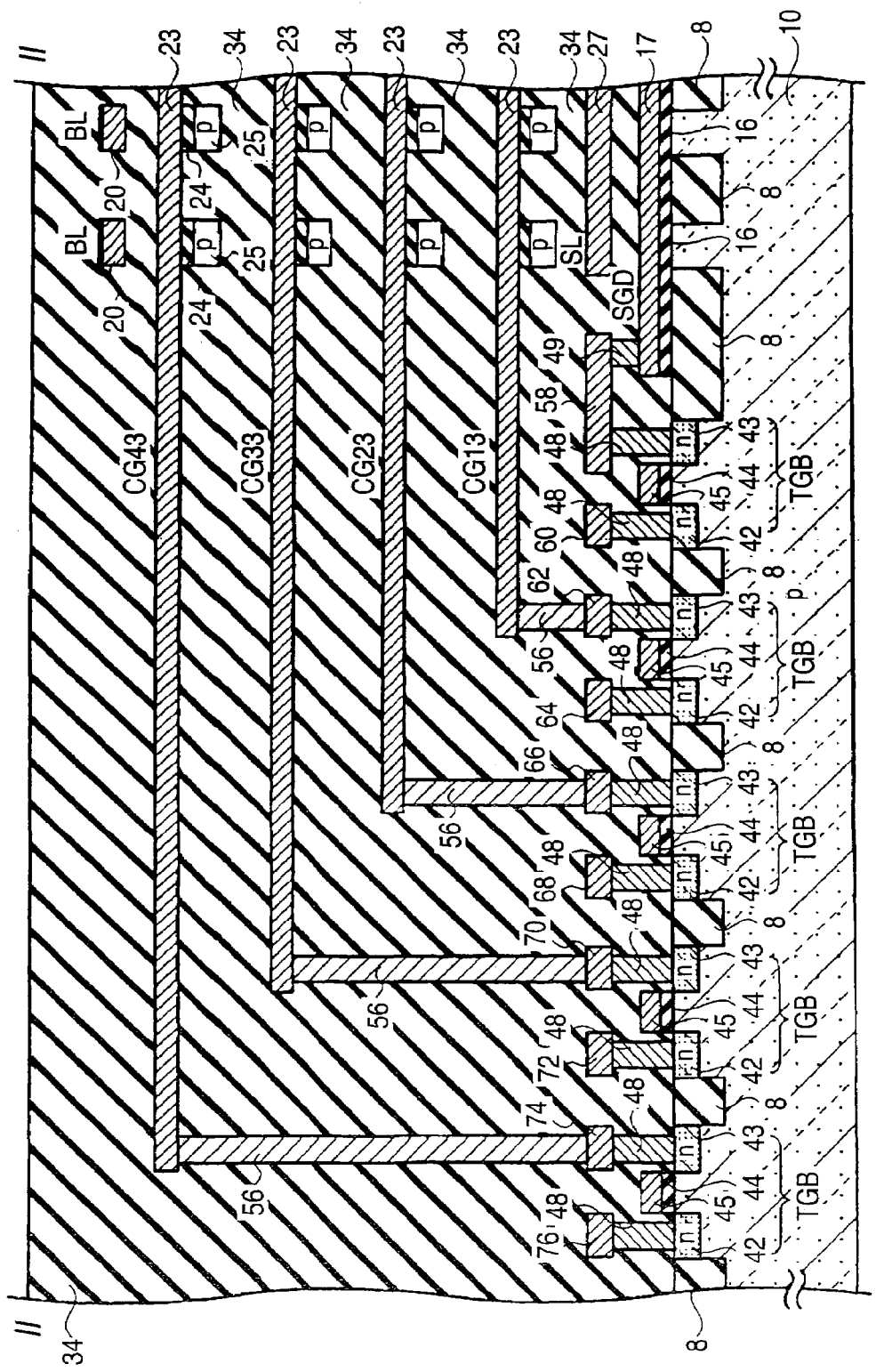
FIG. 28 is an exemplary drawing to show the schematic sectional structure of a NAND cell unit using a SONOS/TFT structure for memory cell transistors in a word line extension direction taken on line II-II, of a nonvolatile semiconductor memory according to a sixth embodiment of the invention.

The sectional structure of a NAND cell unit using SONOS transistors as memory cell transistors in a word line extension direction taken on line II-II, of a nonvolatile semiconductor memory according to a sixth embodiment of the invention is represented schematically as shown in FIG. 28. FIG. 28 corresponds to the schematic sectional structure along word lines CG13, CG23, CG33, and CG43 extending in the row direction. For example, it can be seen as the schematic sectional structure taken on line II-II in FIG. 21 or it can also be seen as the schematic sectional structure taken on line II-II when the bit line side selection gate transistor TGD is placed below the memory cell transistor M13 in FIG. 24.

The sectional structure of the nonvolatile semiconductor memory according to the sixth embodiment of the invention in the CG extension direction includes a semiconductor substrate 10, field isolation regions (STI) 8 placed in the semiconductor substrate 10, source/drain regions 42 an 43 of block selection transistors TBG each placed in the semiconductor substrate 10 sandwiched between the field isolation regions 8, gate insulating films 44 each placed on the semiconductor substrate 10 between the source/drain regions 42 and 43, select gate lines (SWG) 45 each placed on the gate insulating film 44, a gate insulating film 16 sandwiched between source/drain regions of a bit line side selection gate transistor TGD and placed on the semiconductor substrate 10 between the field isolation regions 8, a select gate line (SGD) 17 placed on the gate insulating film 16, contact plugs 48 placed on the source/drain regions 42 and 43, a contact plug 49 placed on the select gate line (SGD) 17, metal wiring layers 60, 64, 68, 72, and 76 each connected through a contact plug 48 to the source region 42 of the block selection transistor TGB, a metal wiring layer 58 connected through a contact plug 48 to the drain region 43 of the block selection transistor TGB and connected through a contact plug 49 to the select gate line (SGD) 17 of the bit line side selection gate transistor TGD, metal wiring layers 62, 66, 70, and 74 each connected through a contact plug 48 to the drain region 43 of the block selection transistor TGB, a metal wiring layer 27 placed on the top of the select gate line (SGD) 17 through an interlayer insulating film 34, a contact plug 56 placed on the metal wiring layer 62, a word line CG13 placed on the metal wiring layers 27, 58, 60, and 62 through an interlayer insulating film 34 and connected to the contact plug 56 placed on the metal wiring layer 62, a contact plug 56 placed on the metal wiring layer 66, a word line CG23 placed on the word line CG13 and the metal wiring layers 64 and 66 through an interlayer insulating film 34 and connected to the metal wiring layer 56 placed on the metal wiring layer 66, a contact plug 56 placed on the metal wiring layer 70, a word line CG33 placed on the word line CG23 and the metal wiring layers 68 and 70 through an interlayer insulating film 34 and connected to the metal wiring layer 56 placed on the metal wiring layer 70, a contact plug 56 placed on the metal wiring layer 74, a word line CG43 placed on the word line CG33 and the metal wiring layers 72 and 74 through an interlayer insulating film 34 and connected to the metal wiring layer 56 placed on the metal wiring layer 74, a bit line 20 placed on the word line CG43 through an interlayer insulating film 34, and a source line SL connected to the metal wiring layer 27, as shown in FIG. 28.

According to the NAND-type nonvolatile semiconductor memory according to the sixth embodiment of the invention, the number of the wiring layers of the metal wiring layers is six as shown in FIG. 28.

According to the NAND-type nonvolatile semiconductor memory according to the sixth embodiment of the invention, the number of the metal wiring layers can be decreased and the number of manufacturing steps can be reduced in the planar pattern of the peripheral wiring section from the NAND cell unit 150 to the block selection transistor TGB.

In the description given above, the nonvolatile semiconductor memory has TFTs of the SONOS structure as the memory cell transistors by way of example, but if the nonvolatile semiconductor memory has TFTs of a stack gate stacked structure, the transistors can also be formed as a stack in a similar manner.

According to the NAND-type nonvolatile semiconductor memory according to the sixth embodiment of the invention, while the selection gate transistors are placed on the semiconductor substrate and the selectivity of a NAND type memory cell transistor by the selection gate transistor is maintained, the memory cell transistors of the stack gate/TFT structure or the SONOS/TFT structure can be stacked for providing a large memory capacity.

Other Embodiments

Although the invention has been described with the first to sixth embodiments, it is to be understood that the description and the drawings forming parts of the disclosure do not limit the invention. From the disclosure, various alternative embodiments, examples, and operational arts will be apparent to those skilled in the art.

Further, the memory cell transistors of the nonvolatile semiconductor memory according to the first to sixth embodiments of the invention are not limited to binary logic memory. For example, the memory cell transistors can also be applied to multivalued logic memory of ternary or more. For example, a nonvolatile semiconductor memory of four-valued storage would accomplish a memory capacity twice that of a nonvolatile semiconductor memory of two-valued (binary) storage. Further, the invention can also be applied to a nonvolatile semiconductor memory of multivalued storage of m-valued or more-valued storage (m>3).

Further, the memory cell transistors of the nonvolatile semiconductor memory according to the first to sixth embodiments of the invention are not limited to the stacked structure, the SONOS structure, or the MONOS structure. A side wall control gate type structure or an SOI structure may be applied.

Thus, the invention contains various embodiments, etc., not described herein, of course. Therefore, the technical scope of the invention is to be determined solely by the inventive concepts which are delineated by the claims adequate from the description given above.

What is claimed is:

1. A nonvolatile semiconductor memory comprising:
    a source line side selection gate transistor that includes a first source region connected to a source line and a first gate electrode connected to a first select gate line;
    a bit line side selection gate transistor that includes a second drain region connected to a bit line and a second gate electrode connected to a second select gate line;
    a first memory cell string that includes a plurality of memory cell transistors connected in series, connected between a first drain region of the source line side selection gate transistor and a second source region of the bit line side selection gate transistor; and
    a second memory cell string that includes a plurality of memory cell transistors connected in series, connected between the first drain region of the source line side selection gate transistor and the second source region of the bit line side selection gate transistor;
    wherein the first memory cell string and the second memory cell string are stacked on a semiconductor substrate via an interlayer insulating film,
    wherein the source line side selection gate transistor and the bit line side selection gate transistor are placed on the semiconductor substrate, and
    wherein at least one of the source line side selection gate transistor and the bit line side selection gate transistor is formed between the semiconductor substrate and a lower one of the first memory cell string and the second memory cell string.

2. The nonvolatile semiconductor memory according to claim 1,
    wherein each of the memory cell transistors includes a gate insulating film having a charge storage layer.

3. The nonvolatile semiconductor memory according to claim 2,
    wherein the charge storage layer is made by floating gate.

4. The nonvolatile semiconductor memory according to claim 2,
    wherein the charge storage layer is made by silicon nitride film.

5. The nonvolatile semiconductor memory according to claim 1,
    wherein the memory cell transistor is multivalued logic memory.

6. The nonvolatile semiconductor memory according to claim 1,
    wherein each of the memory cell transistor includes a field isolation region that is placed between the source line side selection gate transistor and the bit line side selection gate transistor.

7. The nonvolatile semiconductor memory according to claim 1,
    wherein, when in read operation, voltages applied to each of a selected control gate, unselected control gates in the same layer of the selected control gate and unselected control gates in the different layer of the selected control gate are different with one another.

8. The nonvolatile semiconductor memory according to claim 1,
    wherein the bit line is formed between the semiconductor substrate and a lower one of the first memory cell string and the second memory cell string.

9. The nonvolatile semiconductor memory according to claim 1,
    wherein the bit line is formed on a higher layer of a higher one of the first memory cell string and the second memory cell string.

10. A nonvolatile semiconductor memory system comprising the nonvolatile semiconductor memory according to claim 1,
    a memory cell unit that is configured by the source line side selection gate transistor, the bit line side selection gate transistor, and the plurality of memory cell strings provided between the source line side selection gate transistor and the bit line side selection gate transistor;
    a memory cell block that includes a plurality of memory cell units arranged in a first direction;
    a memory cell array that includes a plurality of memory cell block arranged in a second direction that is perpendicular to the first direction;
    a first block selection transistor for a first second-selection gate line that is connected to the first second-selection gate line in the memory cell unit of a first memory cell block, the first block selection transistor having a first gate electrode connected to a first row address decoder;
    a second block selection transistor for a first first-selection gate line that is connected to the first first-selection gate line in the memory cell unit of the first memory cell block, the second block selection transistor having a second gate electrode connected to the first row address decoder;
    a third block selection transistor for a first gate line that is connected to the first gate line in the memory cell unit of the first memory cell block, the third block selection transistor having a third gate electrode connected to the first row address decoder;
    a fourth block selection transistor for a second second-selection gate line that is connected to the second second-selection gate line in the memory cell unit of a second memory cell block next to the first memory cell block, the fourth block selection transistor having a fourth gate electrode connected to a second row address decoder;
    a fifth block selection transistor for a second first-selection gate line that is connected to the second first-selection gate line in the memory cell unit of the second memory cell block, the fifth block selection transistor having a fifth gate electrode connected to the second row address decoder;
    a sixth block selection transistor for a second gate line that is connected to the second gate line in the memory cell unit of the second memory cell block, the sixth block selection transistor having a third gate electrode connected to the second row address decoder; and
    wherein the first row address decoder and the second row address decoder are provided at opposite sides with respect to the memory cell array, respectively.

11. The nonvolatile semiconductor memory according to claim 1,
    wherein the source line side selection gate transistor, the bit line side selection gate transistor, and the plurality of memory cell strings provided between the source line side selection gate transistor and the bit line side selection gate transistor form a memory cell unit;
    wherein a memory cell block includes a plurality of memory cell units arranged in a first direction;

wherein a memory cell array includes a plurality of memory cell block arranged in a second direction that is perpendicular to the first direction;

wherein a first block selection transistor for a first second-selection gate line is connected to the first second-selection gate line in a memory cell unit of a first memory cell block, the first block selection transistor having a first gate electrode connected to a first row address decoder;

wherein a second block selection transistor for a first first-selection gate line is connected to the first first-selection gate line in the memory cell unit of the first memory cell block, the second block selection transistor having a second gate electrode connected to the first row address decoder;

wherein a third block selection transistor for a first gate line is connected to the first gate line of odd number memory string in the memory cell unit of the first memory cell block, the third block selection transistor having a third gate electrode connected to the first row address decoder;

wherein a fourth block selection transistor for a second gate line is connected to the second gate line of even number memory string in the memory cell unit of the first memory cell block, the fourth block selection transistor having a fourth gate electrode connected to a second row address decoder; and wherein the first row address decoder and the second row address decoder are provided at opposite sides with respect to the memory cell array, respectively.

12. A nonvolatile semiconductor memory comprising:

a source line side selection gate transistor that includes a first source region connected to a source line and a first gate electrode connected to a first select gate line;

a bit line side selection gate transistor that includes a second drain region connected to a bit line and a second gate electrode connected to a second select gate line;

a first memory cell string that includes a plurality of memory cell transistors connected in series, connected between a first drain region of the source line side selection gate transistor and a second source region of the bit line side selection gate transistor; and a second memory cell string that includes a plurality of memory cell transistors connected in series, connected between the first drain region of the source line side selection gate transistor and the second source region of the bit line side selection gate transistor;

wherein the first memory cell string and the second memory cell string are stacked on a semiconductor substrate via an interlayer insulating film, wherein the source line side selection gate transistor and the bit line side selection gate transistor are placed on the semiconductor substrate, and wherein the memory cell transistors include a back gate electrode connected to a back gate line extending in a row direction orthogonal to the bit line.

13. The nonvolatile semiconductor memory according to claim 12, wherein the back gate line extends in a direction in which the bit line extends.

14. The nonvolatile semiconductor memory according to claim 12, wherein the back gate electrode is placed at opposite side of the gate electrode of each of the memory cell transistor.

15. A nonvolatile semiconductor memory comprising:

a source line side selection gate transistor that includes a first source region connected to a source line and a first gate electrode connected to a first select gate line;

a bit line side selection gate transistor that includes a second drain region connected to a bit line and a second gate electrode connected to a second select gate line;

a first memory cell string that includes a plurality of memory cell transistors connected in series, connected between a first drain region of the source line side selection gate transistor and a second source region of the bit line side selection gate transistor; and a second memory cell string that includes a plurality of memory cell transistors connected in series, connected in parallel with the first memory cell string;

wherein the first memory cell string and the second memory cell string are stacked on a semiconductor substrate via an interlayer insulating film, wherein the source line side selection gate transistor and the bit line side selection gate transistor are placed on the semiconductor substrate, wherein the source line side selection gate transistor, the bit line side selection gate transistor, and the plurality of memory cell strings provided between the source line side selection gate transistor and the bit line side selection gate transistor form a memory cell unit;

wherein a memory cell block includes a plurality of memory cell units arranged in a first direction;

wherein a memory cell array includes a plurality of memory cell block arranged in a second direction that is perpendicular to the first direction;

wherein a first block selection transistor for a first second-selection gate line is connected to the first second-selection gate line in a memory cell unit of a first memory cell block, the first block selection transistor having a first gate electrode connected to a first row address decoder;

wherein a second block selection transistor for a first gate line is connected to the first gate line of odd number memory string in the memory cell unit of the first memory cell block, the second block selection transistor having a second gate electrode connected to the first row address decoder;

wherein a third block selection transistor for a first first-selection gate line is connected to the first first-selection gate line in the memory cell unit of the first memory cell block, the third block selection transistor having a third gate electrode connected to a second row address decoder;

wherein a fourth block selection transistor for a second gate line is connected to the second gate line of even number memory string in the memory cell unit of the first memory cell block, the fourth block selection transistor having a fourth gate electrode connected to the second row address decoder; and wherein the first row address decoder and the second row address decoder are provided at opposite sides with respect to the memory cell array, respectively.

16. A nonvolatile semiconductor memory comprising:

a source line side selection gate transistor that includes a first source region connected to a source line and a first gate electrode connected to a first select gate line;

a bit line side selection gate transistor that includes a second drain region connected to a bit line and a second gate electrode connected to a second select gate line;

a plurality of memory cell strings each including a plurality of memory cell transistors connected in series, the memory cell strings being connected in parallel between a first drain region of the source line side selection gate transistor and a second source region of the bit line side selection gate transistor, wherein, an erase operation of a selected memory cell string includes applying a first predetermined voltage to each gate electrode of the selected memory cell string sequentially starting from the gate electrode nearest to the source line, the erase operation further including applying a second predetermined voltage to the source line and each gate electrode of unselected memory cell strings during the erase operation.

* * * * *